(12) United States Patent
Chang et al.

(10) Patent No.: US 9,899,337 B2
(45) Date of Patent: Feb. 20, 2018

(54) SEMICONDUCTOR PACKAGE AND MANUFACTURING METHOD THEREOF

(71) Applicant: SAMSUNG ELECTRONICS CO., LTD., Suwon-si, Gyeonggi-Do (KR)

(72) Inventors: Gun-ho Chang, Seoul (KR); Tae-je Cho, Yongin-si (KR); Jong-bo Shim, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/174,411

(22) Filed: Jun. 6, 2016

(65) Prior Publication Data

US 2017/0047294 A1 Feb. 16, 2017

(30) Foreign Application Priority Data

Aug. 13, 2015 (KR) .......... 10-2015-0114547

(51) Int. Cl.
*H01L 23/00* (2006.01)
*H01L 25/065* (2006.01)
(Continued)

(52) U.S. Cl.
CPC .......... *H01L 23/562* (2013.01); *H01L 21/561* (2013.01); *H01L 21/568* (2013.01); *H01L 23/5389* (2013.01); *H01L 24/19* (2013.01); *H01L 24/20* (2013.01); *H01L 24/94* (2013.01); *H01L 24/96* (2013.01); *H01L 24/97* (2013.01); *H01L 25/0657* (2013.01); *H01L 25/50* (2013.01); *H01L 2224/0401* (2013.01); *H01L 2224/04105* (2013.01); *H01L 2224/0557* (2013.01); *H01L 2224/12105* (2013.01); *H01L 2224/14181* (2013.01); *H01L 2224/16145* (2013.01); *H01L 2224/27002* (2013.01); *H01L 2224/32145* (2013.01); *H01L 2224/73204* (2013.01); *H01L 2224/73259* (2013.01); *H01L 2224/81005* (2013.01); *H01L 2224/83005* (2013.01); *H01L 2224/83192* (2013.01); *H01L 2224/92224* (2013.01);
(Continued)

(58) Field of Classification Search
CPC ....................................................... H01L 23/562
See application file for complete search history.

(56) References Cited

U.S. PATENT DOCUMENTS 7,955,884 B2  6/2011  Kang et al.
8,384,203 B2  2/2013  Toh et al.
(Continued)

FOREIGN PATENT DOCUMENTS

JP  2003-258153  9/2003
JP  2007-115789  5/2007
(Continued)

*Primary Examiner* — William Harriston
(74) *Attorney, Agent, or Firm* — F. Chau & Associates, LLC

(57) ABSTRACT

A semiconductor package includes a package member and a stress controlling layer. The package member includes an encapsulation layer and at least one chip. The encapsulation layer encapsulates the at least one chip. The stress controlling layer is disposed on a surface of the package member. The stress controlling layer has an internal stress to the extent that the stress controlling layer prevents the package member from having warpage.

12 Claims, 51 Drawing Sheets

(51) Int. Cl.
*H01L 25/00* (2006.01)
*H01L 21/56* (2006.01)
*H01L 23/538* (2006.01)

(52) U.S. Cl.
CPC ...... *H01L 2224/94* (2013.01); *H01L 2224/97* (2013.01); *H01L 2225/06513* (2013.01); *H01L 2225/06541* (2013.01); *H01L 2225/06568* (2013.01); *H01L 2225/06582* (2013.01)

(56) References Cited

U.S. PATENT DOCUMENTS

| | | | |
|---|---|---|---|
| 8,448,506 B2 | 5/2013 | Yoon et al. | |
| 8,835,230 B2 | 9/2014 | Scanlan | |
| 8,895,367 B2 | 11/2014 | Huang et al. | |
| 8,927,334 B2 | 1/2015 | Daubenspeck et al. | |
| 8,945,985 B2 | 2/2015 | Kim et al. | |
| 8,987,050 B1 | 3/2015 | Hiner et al. | |
| 9,006,030 B1* | 4/2015 | Kwon | H01L 23/562 438/108 |
| 2004/0222508 A1 | 11/2004 | Aoyagi | |
| 2007/0020908 A1 | 1/2007 | Honer et al. | |
| 2011/0285014 A1* | 11/2011 | Shen | H01L 21/76898 257/737 |
| 2015/0171028 A1* | 6/2015 | Jo | H01L 23/562 257/713 |

FOREIGN PATENT DOCUMENTS

| | | |
|---|---|---|
| JP | 2007-227608 | 9/2007 |
| JP | 2011-176299 | 9/2011 |
| KR | 1020140038078 | 3/2014 |

\* cited by examiner

SEMICONDUCTOR PACKAGE AND MANUFACTURING METHOD THEREOF

CROSS-REFERENCE TO RELATED APPLICATION

This application claims priority under 35 USC 119 to Korean Patent Application No. 10-2015-0114547, filed on Aug. 13, 2015 in the Korean Intellectual Property Office, the disclosure of which is incorporated by reference herein in its entirety.

TECHNICAL FIELD

The present inventive concept relates to a semiconductor package and a manufacturing method thereof.

DISCUSSION OF RELATED ART

As semiconductor wafers increase in size or decrease in thickness, warpage may occur in the process of fabricating the semiconductor wafers. While a chip is being fabricated on a semiconductor wafer or a fabricated chip is being packaged, warpage, which indicates unintended curvature of a semiconductor chip or a semiconductor package, may occur due to differences between coefficients of thermal expansion (CTE) of respective components constituting a chip or a semiconductor package.

SUMMARY

According to an exemplary embodiment of the present inventive concept, a semiconductor package includes a package member and a stress controlling layer. The package member includes an encapsulation layer and at least one chip. The encapsulation layer encapsulates the at least one chip. The stress controlling layer is disposed on a surface of the package member. The stress controlling layer has an internal stress to the extent that the stress controlling layer prevents the package member from having warpage.

According to an exemplary embodiment of the present inventive concept, a semiconductor package includes a first chip, a second chip, an encapsulation layer and a stress control layer. The second chip is mounted on the first chip. The second chip is connected to the first chip through an internal connection member. The encapsulation layer encapsulates the second chip and exposes a front surface of the second chip. The stress control layer is disposed on the front surface of the second chip. The stress controlling layer has an internal stress to the extent that the stress controlling layer prevents the second chip from having warpage.

According to an exemplary embodiment of the present inventive concept, a semiconductor package includes a chip, an encapsulation layer, external connection members and a stress control layer. The encapsulation layer encapsulates a rear surface and lateral surfaces of the chip and exposes a front surface of the chip. The external connection members are disposed on the front surface or the rear surface of the chip. The stress control layer is disposed on the front surface of the chip and a surface of the encapsulation layer. The stress controlling layer includes an internal stress to the extent that the stress controlling layer prevents the chip from having warpage.

According to an exemplary embodiment of the present inventive concept,
a semiconductor package is provided as follows. The semiconductor package includes a first chip, a second chip mounted on the first chip, and a chip penetrating via electrode connecting the first chip and the second chip. The semiconductor package further includes a base encapsulation layer filling a space between the first chip and the second chip, an encapsulation layer encapsulating the first chip, the second chip and the base encapsulation layer, and a first stress controlling layer disposed on a surface of the encapsulation layer. The first stress controlling layer includes an internal stress to the extent that the first stress controlling layer prevents the second chip from having warpage.

According to an exemplary embodiment of the present inventive concept, a method of fabricating a semiconductor package is provided as follows. A package member is attached to a supporting carrier. An encapsulation layer is formed to encapsulate the package member. After the formation of the encapsulation layer, a stress control layer is formed on at least one of surfaces of the supporting carrier and the package member to offset warpage of the package member caused by the formation of the encapsulation layer.

According to an exemplary embodiment of the present inventive concept,
a semiconductor package is provided as follows. The semiconductor includes a base chip and chips. The base chip and chips are stacked on each other and the base chip is a lowermost chip of a stacked chip of the base chip and the chips. The semiconductor further includes a first stress controlling layer, a base encapsulating layer interposed between the first stress controlling layer and the base chip, a second stress controlling layer interposed between the base chip and a bottommost chip of the chips, an encapsulating layer covering the stacked chip, and a third stress controlling layer disposed on an upper surface of the encapsulating layer. The first stress controlling layer and the second stress controlling layer are arranged to prevents the base chip from having warpage. The third stress controlling layer has an internal stress such that the third stress controlling layer prevents an uppermost chip of the chips from having warpage.

BRIEF DESCRIPTION OF THE DRAWINGS

These and other features of the inventive concept will become more apparent by describing in detail exemplary embodiments thereof with reference to the accompanying drawings of which.

Figure 1A:
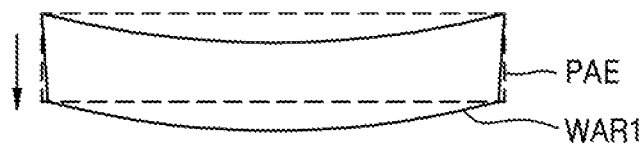
FIGS. 1A to 1D are diagrams for describing a semiconductor package and a method of fabricating the same, according to an embodiment of the inventive concept.

Sizes and thicknesses of constituent members shown in the accompanying drawings are arbitrarily given for better understanding and ease of description. In the drawings, the thicknesses and/or areas of layers, films, regions, etc., are exaggerated for clarity.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Exemplary embodiments of the inventive concept are described herein with reference to cross-section illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

The below embodiments of the inventive concept may be independently embodied or one or more of the below embodiments may be embodied in combinations. Therefore, the technical spirit of the inventive concept is not limited to a particular embodiment.

FIGS. 1A to 1D are diagrams for describing a semiconductor package and a method of fabricating the same, according to an exemplary embodiment of the present inventive concept.

FIG. 1A shows a package element PAE. The package element PAE includes a chip embodied on a semiconductor wafer (or a semiconductor substrate), a plurality of chips stacked on a semiconductor wafer, or chips encapsulated (or sealed) by an enencapsulation layer (encapsulant layer or sealant layer) on a semiconductor wafer. The package element PAE may be an interim result when fabricating a semiconductor package.

In the package element PAE, a first warpage WAR1 may occur due to a difference between thermal expansion coefficients of respective components or various operational variables in the fabricating of the semiconductor package. FIG. 1A shows an example of the first warpage WAR1 in which the package element PAE is curved downward. For convenience of explanation, it may be defined that the first warpage WAR1 of the package element PAE curved downward has a positive value. If the package element PAE is curved upward, it may be defined that the first warpage WAR1 of the package element PAE curved upward has a negative value for convenience of explanation.

Figure 1B:
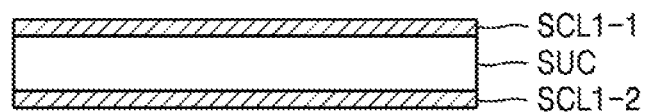

FIG. 1B shows a supporting carrier SUC for supporting the package element PAE and stress controlling layers SCL1-1 and SCL1-2. The stress controlling layers SCL1-1 and SCL1-2 are formed on the front surface and the rear surface of the supporting carrier SUC, respectively. The supporting carrier SUC may be formed of silicon, germanium, silicon-germanium, gallium-arsenic (GaAs), glass, metal, plastic, or ceramic. Although FIG. 1B shows that the stress controlling layers SCL1-1 and SCL1-2 are formed on both the front surface and the rear surface of the supporting carrier SUC, the stress controlling layers SCL1-1 and SCL1-2 may be formed on at least one of the front surface and the rear surface of the supporting carrier SUC.

The supporting carrier SUC may correspond to size of the package element PAE. For example, if the package element PAE has a size of a semiconductor wafer, the supporting carrier SUC and the semiconductor wafer may be matched in shape and size to each other or may be congruent. The stress controlling layers SCL1-1 and SCL1-2 may exhibit tensile stresses or compressive stresses.

The stress controlling layers SCL1-1 and SCL1-2 may apply internal stresses of tensile stresses or compression stresses to the supporting carrier SUC to remove the warpage of the supporting carrier SUC. For example, the stress controlling layers SCL1-1 and SCL1-2 may be formed to have a predetermined thickness so that the stress controlling layers SCL1-1 and SCL1-2 may have internal stresses to prevent the package element PAE from having warpage. For example, the thicknesses of the stress controlling layers SCL1-1 and SCL1-2 may range from about 1 nm to about 1 mm. The internal stresses of the stress controlling layers SCL1-1 and SCL1-2 may be from about −1 GPa to about 1 GPa. Therefore, the stress controlling layers SCL1-1 and SCL1-2 may remove warpage from about −1 mm to about +1 mm in the package element PAE.

The stress controlling layers SCL1-1 and SCL1-2 may be formed of oxide layers, nitride layers, polymer layers, or a combination thereof. The stress controlling layers SCL1-1 and SCL1-2 may be formed using a chemical vapour deposition (CVD) process, a spin coating process, or a physical vapour deposition (PVD) process.

Figure 1C:
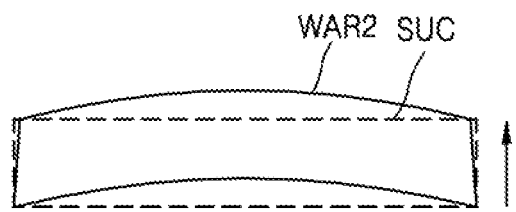

FIG. 1C shows that the supporting carrier SUC has a second warpage WAR2 due to the stress controlling layers SCL1-1 and SCL1-2. The supporting carrier SUC may have the second warpage WAR2 upward due to the stress controlling layers SCL1-1 and SCL1-2. The second warpage WAR2 may have a negative value. For example, the second warpage WAR2 may be curved in a direction opposite that of the first warpage WAR1, that is, in an upward direction.

The second warpage WAR2 may be set to offset or remove the first warpage WAR1. The second warpage WAR2 may be set by the kinds and thicknesses of the stress controlling layers SCL1-1 and SCL1-2. For example, the second warpage WAR2 may be created by forming the stress controlling layer SCL1-1 to have a first kind and a first thickness and by forming the stress controlling layer SCL1-2 to have a second kind and a second thickness. In an exemplary embodiment, the first kind and the second kind may be substantially the same. In an exemplary embodiment, the first kind and the second kind may be different from each other. In an exemplary embodiment, the first thickness and the second thickness may be substantially the same. In an exemplary embodiment, the first thickness and the second thickness may be different from each other.

Figure 1D:
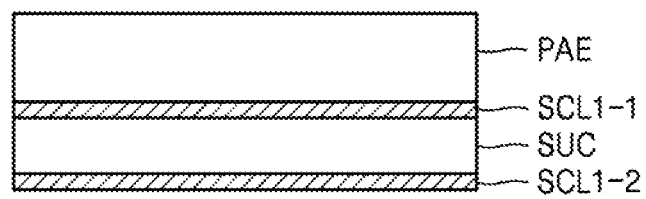

FIG. 1D shows that the package element PAE is mounted on the supporting carrier SUC so that the first warpage WAR1 of the package element PAE is offset or removed by the second warpage WAR2 of the supporting carrier SSUC. In this case, the package element PAE and the supporting carrier SUC need not be curved due to the stress controlling layers SCL1-1 and SCL1-2 formed on the front surface and the rear surface of the supporting carrier SUC. For example, the stress controlling layers SCL1-1 and SCL1-2 formed on the supporting carrier SUC may have the second warpage WAR2 and may offset the first warpage WAR1 occurring at the package element PAE.

FIG. 2A to 2E are diagrams for describing a semiconductor package and a method of fabricating the same according to an exemplary embodiment of the inventive concept.

In detail, the structure shown in FIG. 2 is identical to that of FIG. 1 except that stress controlling layers SCL1-1 and SCL1-2 are formed on a package element PAE. Descriptions of FIG. 2 identical to those of FIG. 1 will be briefly given or omitted for convenience of explanation.

Figure 2A:
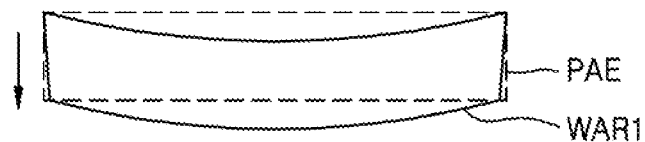
FIGS. 2A to 2E are diagrams for describing a semiconductor package and a method of fabricating the same according to an embodiment of the inventive concept.
Figure 2B:
Figure 2C:
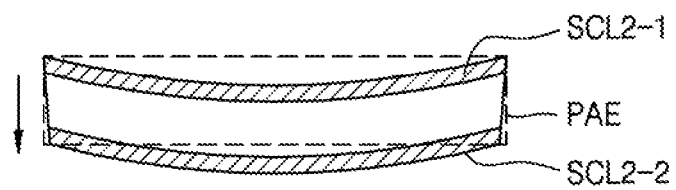

FIG. 2A shows a package element PAE. The package element PAE may have a first warpage WAR1 curved downward which may be generated in the fabrication process of the package element PAE. FIG. 2B shows a supporting carrier SUC for supporting the package element PAE. FIG. 2C shows stress controlling layers SCL2-1 and SCL2-2 formed on the front surface and the rear surface of the supporting carrier SUC, respectively. The stress controlling layers SCL2-1 and SCL2-2 may be formed on at least one of the front surface and the rear surface of the supporting carrier SUC as an occasion demands. The stress controlling layers SCL2-1 and SCL2-2 may be identical to the stress controlling layers SCL1-1 and SCL1-2 of FIG. 1 described above.

Figure 2D:
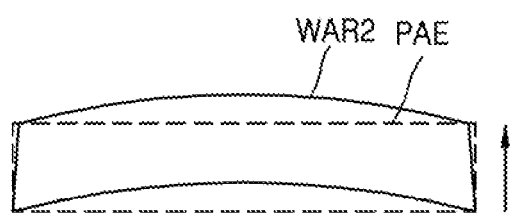

FIG. 2D shows that the package element PAE has the second warpage WAR2 due to the stress controlling layers SCL2-1 and SCL2-2. The package element PAE may have the second warpage WAR2 in an upward direction due to the stress controlling layers SCL2-1 and SCL2-2. The second warpage WAR2 may have a negative value. For example, the second warpage WAR2 is curved in a direction opposite that of the first warpage WAR1, that is, in an upward direction. The second warpage WAR2 may offset the first warpage WAR1.

The second warpage WAR2 may be obtained by controlling the kinds and thicknesses of the stress controlling layers SCL2-1 and SCL2-2. For example, the second warpage WAR2 may be controlled by forming the stress controlling layer SCL2-1 to have a first kind and a first thickness and forming the stress controlling layer SCL2-2 to have a second kind and a second thickness. In an exemplary embodiment, the first kind and the second kind may be substantially the same. In an exemplary embodiment, the first kind and the second kind may be different from each other. In an exemplary embodiment, the first thickness and the second thickness may be substantially the same. In an exemplary embodiment, the first thickness and the second thickness may be different from each other.

Figure 2E:
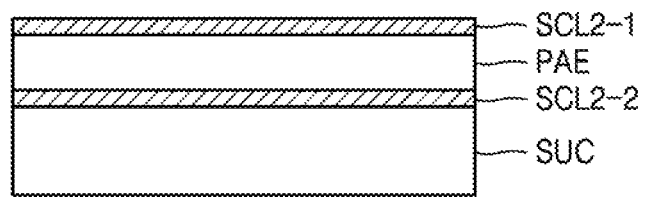

FIG. 2E shows that the package element PAE is mounted on the supporting carrier SUC. If the package element PAE is mounted on the supporting carrier SUC, the package element PAE and the supporting carrier SUC need not be curved due to the stress controlling layers SCL2-1 and SCL2-2 formed on the front surface and the rear surface of the supporting carrier SUC. For example, the stress controlling layers SCL2-1 and SCL2-2 formed on the supporting carrier SUC may have the second warpage WAR2 and may offset the first warpage WAR1 occurring at the package element PAE.

Figure 3A:
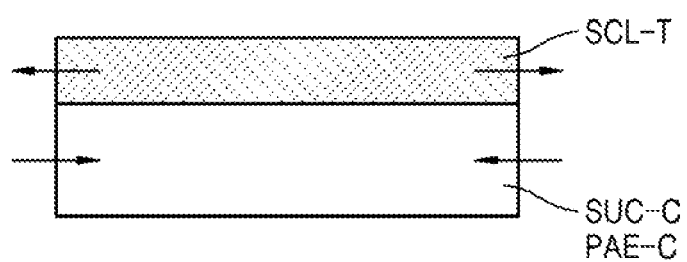
FIGS. 3A and 3B and FIGS. 4A and 4B are diagrams for describing stress relationships between the package member, the supporting carrier, and the stress controlling layers of FIGS. 1 and 2.
Figure 3B:
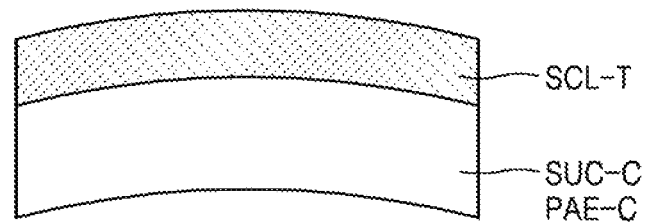
Figure 4A:
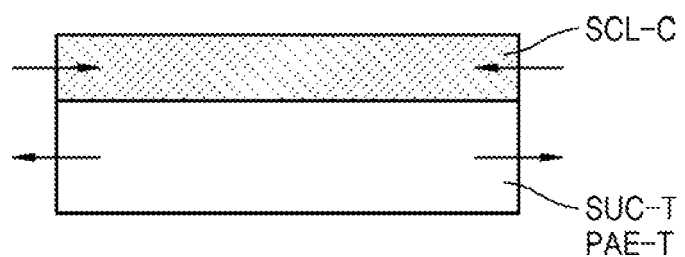
Figure 4B:
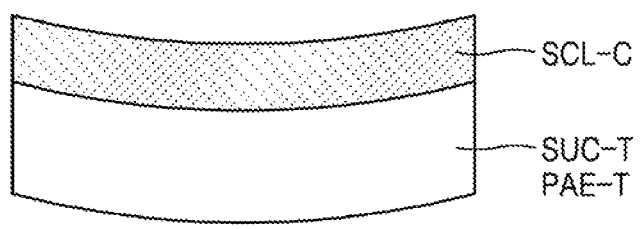

FIGS. 3 and 4 are diagrams for describing stress relationships between the package member, the supporting carrier, and the stress controlling layers of FIGS. 1 and 2. FIG. 3 includes FIG. 3A and FIG. 3B, and FIG. 3 may be referred to as FIGS. 3A and 3B. FIG. 4 includes FIG. 4A and FIG. 4B, and FIG. 4 may be referred to as FIGS. 4A and 4B.

FIG. 3A shows that a stress controlling layer SCL-T having a tensile stress is formed on a package element PAE-C or a supporting carrier SUC-C. The tensile stress may be exerted in outward directions as indicated by arrows. The package element PAE-C or the supporting carrier SUC-C may have a compressive stress which is exerted in inward directions as indicated by arrows. Therefore, the package element PAE-C or the supporting carrier SUC-C may be curved downward and may be concave downward.

FIG. 4A shows that a stress controlling layer SCL-C exhibiting a compressive stress is formed on a package element PAE-T or a supporting carrier SUC-T. The compressive stress may be exerted in inward directions as indicated by arrows. The package element PAE-T or the supporting carrier SUC-T may have a tensile stress which is exerted in outward directions as indicated by arrows. Therefore, the package element PAE-C or the supporting carrier SUC-C may be curved upward and be convex upward.

The curved directions of the package element PAE or the supporting carrier SUC may be adjusted by using the stress controlling layers SCL1-1, SCL1-2, SCL2-1, and SCL2-2 formed on the package element PAE or the supporting carrier SUC.

Hereinafter, a semiconductor package according to an exemplary embodiment of the inventive concept and a method of fabricating the same will be described. According to an exemplary embodiment, warpage of a semiconductor package may be adjusted (or controlled) by forming at least one of the stress controlling layers SCL1-1 and SCL1-2 on the supporting carrier SUC or forming at least one of the stress controlling layers SCL2-1 and SCL2-2 on the package element PAE.

FIGS. 5 to 15 are sectional view diagrams for describing a semiconductor package according to an exemplary embodiment of the present inventive concept and a method of fabricating the same. FIGS. 5 to 15 show that a semiconductor package has a chip-on-wafer (COW) structure in which a second chip 200 is stacked on a base wafer 10 including first chips 100.

Figure 5:
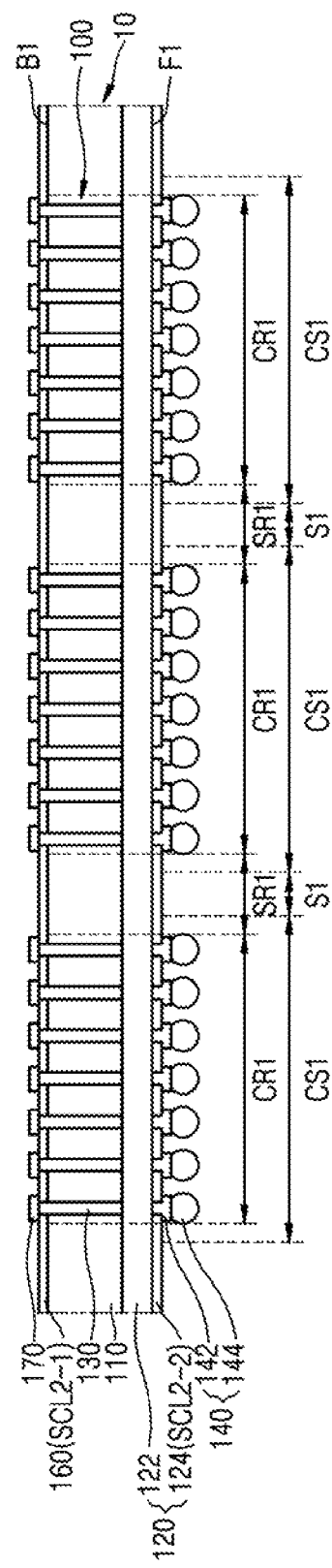
FIGS. 5 to 15 are sectional view diagrams for describing a semiconductor package according to an embodiment of the inventive concept and a method of fabricating the same.

Referring to FIG. 5, the base wafer 10 includes a plurality of chips 100. Through silicon vias (TSVs) 130 penetrates the chips 100. The base wafer 10 is completed by simultaneously forming the chips 100 including TSVs 130 at the wafer level. For example, the chips 100 are spaced apart from each other in the base wafer 10. The TSV 130 may be referred to as a chip penetrating via electrode.

The bottom surface of the base wafer 10 may be referred to as a front surface F1 on which an integrated circuit layer or an active region constituting the chip 100 is located, whereas the top surface of the base wafer 10 may be referred to as a rear surface B1 on which no integrated circuit layer or active region constituting the chip 100 is located. At the base wafer 10, size of a chip region is indicated as size CR1. Size CR1 of a chip region may be a width or a length. Size of a scribe line between the chips 100 is indicated as size SR1. Size SR1 of a scribe line region may be a width or a length.

Size of the chip 100 completed by sawing the base wafer 10 in a later operation may be indicated as size CS1. Size CS1 of the chip 100 may be a width or a length. Size sawed by a blade in a scribe line region is indicated as size S1. The size S1 sawed by a blade in a scribe line region may be width of the blade. FIG. 5 shows three chips 100 in the base wafer 10 for convenience of explanation. The present inventive concept is not limited thereto. For example, the number of the chips 100 may be more than three. For example, dozens to hundreds of the chips may be formed in the base wafer 10.

The base wafer 10 includes a body layer 110, a bottom insulation layer 120, the TSV 130, an external connection member 140, a first stress controlling layer 160 (SCL2-1) for a package, a second stress controlling layer 124 (SCL2-2) for a package, and a top pad 170. The body layer 110 may include a silicon substrate (not shown), an integrated circuit layer (not shown) formed on the silicon substrate, and an interlayer insulation layer (not shown) covering the integrated circuit layer. The bottom insulation layer 120 is formed below the body layer 110 and may include an inter-metal insulation layer 122 and the second stress controlling layer 124 (SCL2-2) for a package. A multilayer wiring patterns (not shown) may be formed in the inter-metal insulation layer 122.

The TSV 130 penetrates through the body layer 110 and be connected to the multilayer wiring pattern of the bottom insulation layer 120. The external connection member 140 includes a bump pad 142 and a bump 144. The bump pad 142 is formed of a conductive material on the second stress controlling layer 124 (SCL2-2) for a package and may be electrically connected to the multilayer wiring pattern in the bottom insulation layer 120. Therefore, the bump pad 142 may be electrically connected to the TSV 130 via the multilayer wiring pattern.

An under bump metal (UBM) (not shown) may be formed on the bump pad 142. The bump pad 142 may be formed of aluminum or copper and may be formed using a pulse plating process or a direct current plating process. However, materials and methods for forming the bump pad 142 are not limited thereto.

The bump 144 is formed on the bump pad 142. The bump 144 may be formed of a conductive material including, e.g., copper (Cu), aluminum (Al), gold (Au), solder, etc. However, materials for forming the bump 144 are not limited thereto. If the bump 144 is formed of solder, the bump 144 may also be referred to as a solder bump.

The first stress controlling layer 160 (SCL2-1) for a package and the second stress controlling layer 124 (SCL2-2) for a package may control warpage of the base wafer 10. The first stress controlling layer 160 (SCL2-1) for a package may be a protection layer formed of an insulation material on the top surface of the body layer 110 to protect the body layer 110 from the outside. The second stress controlling layer 124 (SCL2-2) for a package may be a passivation layer for insulating the external connection member 140.

The first stress controlling layer 160 (SCL2-1) for a package and the second stress controlling layer 124 (SCL2-2) for a package may be formed via a high density plasma chemical vapour deposition (HDP-CVD) process. In an exemplary embodiment, the first stress controlling layer 160 (SCL2-1) for a package and the second stress controlling layer 124 (SCL2-2) for a package may be formed using a chemical vapour deposition (CVD) process, a spin coating process, or a physical vapour deposition (PVD) process.

The first stress controlling layer 160 (SCL2-1) for a package and the second stress controlling layer 124 (SCL2-2) for a package may be formed of oxide layers, nitride layers, polymer layers, or combinations thereof. The first stress controlling layer 160 (SCL2-1) for a package and the second stress controlling layer 124 (SCL2-2) for a package may be formed to have a thickness from about 1 nm to about 1 mm.

The top pad 170 is formed on the first stress controlling layer 160 (SCL2-1) for a package and is connected to the TSV 130. The top pad 170 may be formed of aluminium or copper. In an exemplary embodiment, the top pad 170 and the bump pad 142 may be formed of substantially the same material.

Figure 6:
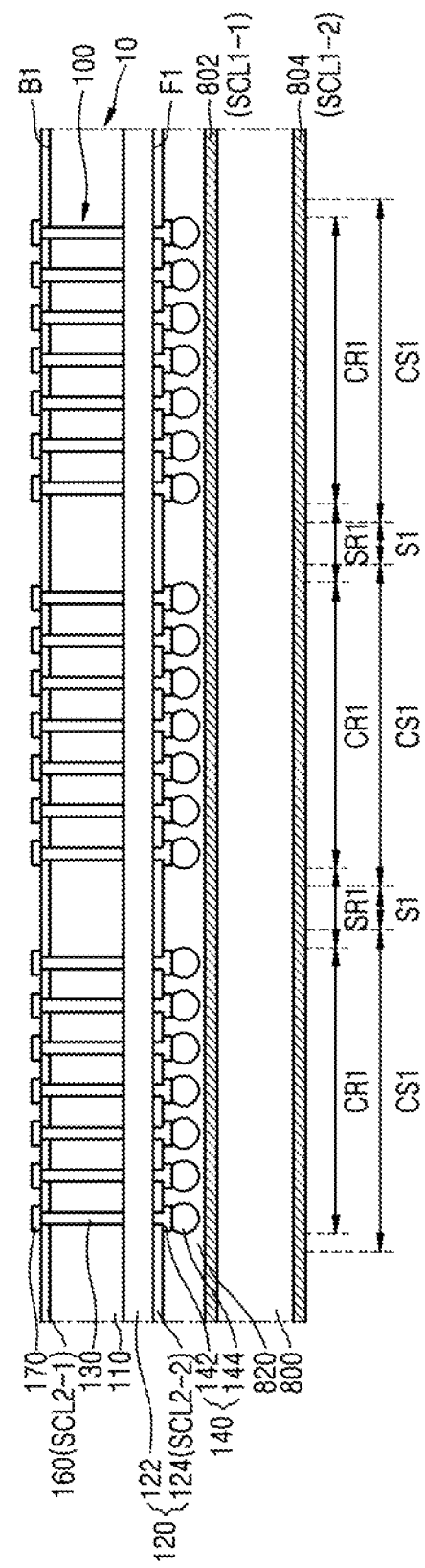

Referring to FIG. 6, a supporting carrier 800 is prepared. A first stress controlling layer 802 (SCL1-1) for a carrier and a second stress controlling layer 804 (SCL1-2) for a carrier are formed on the front surface and the rear surface of the supporting carrier 800, respectively. The first stress controlling layer 802 (SCL1-1) for a carrier and the second stress controlling layer 804 (SCL1-2) for a carrier may control warpage of the base wafer 10.

The first stress controlling layer 802 (SCL1-1) for a carrier and the second stress controlling layer 804 (SCL1-2) for a carrier may be formed of oxide layers, nitride layers, polymer layers, or combinations thereof. The first stress controlling layer 802 (SCL1-1) for a carrier and the second stress controlling layer 804 (SCL1-2) for a carrier may be formed using a chemical vapour deposition (CVD) process, a spin coating process, or a physical vapour deposition (PVD) process. The first stress controlling layer 802 (SCL1-

1) for a carrier and the second stress controlling layer 804 (SCL1-2) for a carrier may be formed to have a thickness from about 1 nm to about 1 mm.

The internal stresses of the first stress controlling layer 802 (SCL1-1) for a carrier and the second stress controlling layer 804 (SCL1-2) for a carrier may be from about −1 GPa to about 1 GPa. Therefore, the first stress controlling layer 802 (SCL1-1) for a carrier and the second stress controlling layer 804 (SCL1-2) for a carrier may compensate warpage from about −1 mm to about +1 mm. The first stress controlling layer 802 (SCL1-1) for a carrier and the second stress controlling layer 804 (SCL1-2) for a carrier may be formed as layers of different types. An adhering member 820 is formed on the first stress controlling layer 802 (SCL1-1) for a carrier of the supporting carrier 800. The supporting carrier 800 may be formed of silicon, germanium, silicon-germanium, gallium-arsenic (GaAs), glass, metal, plastic, or ceramic.

According to an exemplary embodiment, the supporting carrier 800 may be formed of a silicon substrate or a glass substrate. The adhering member 820 may be formed of a non-conductive film (NCF), an anisotropic conductive film (ACF), an UV film, an instant glue, a heat hardening adhesive, a laser hardening adhesive, an ultrasound hardening adhesive, a non-conductive paste (NCP), etc.

The base wafer 10 is adhered onto the first stress controlling layer 802 (SCL1-1) for a carrier of the supporting carrier 800 via the adhering member 820. For example, the base wafer 10 is adhered such that the external connection member 140 faces the supporting carrier 800. The supporting carrier 800 may be prepared before the base wafer 10 is prepared or may be prepared after the base wafer 10 and before the base wafer 10 is adhered to the supporting carrier 800.

Figure 7:
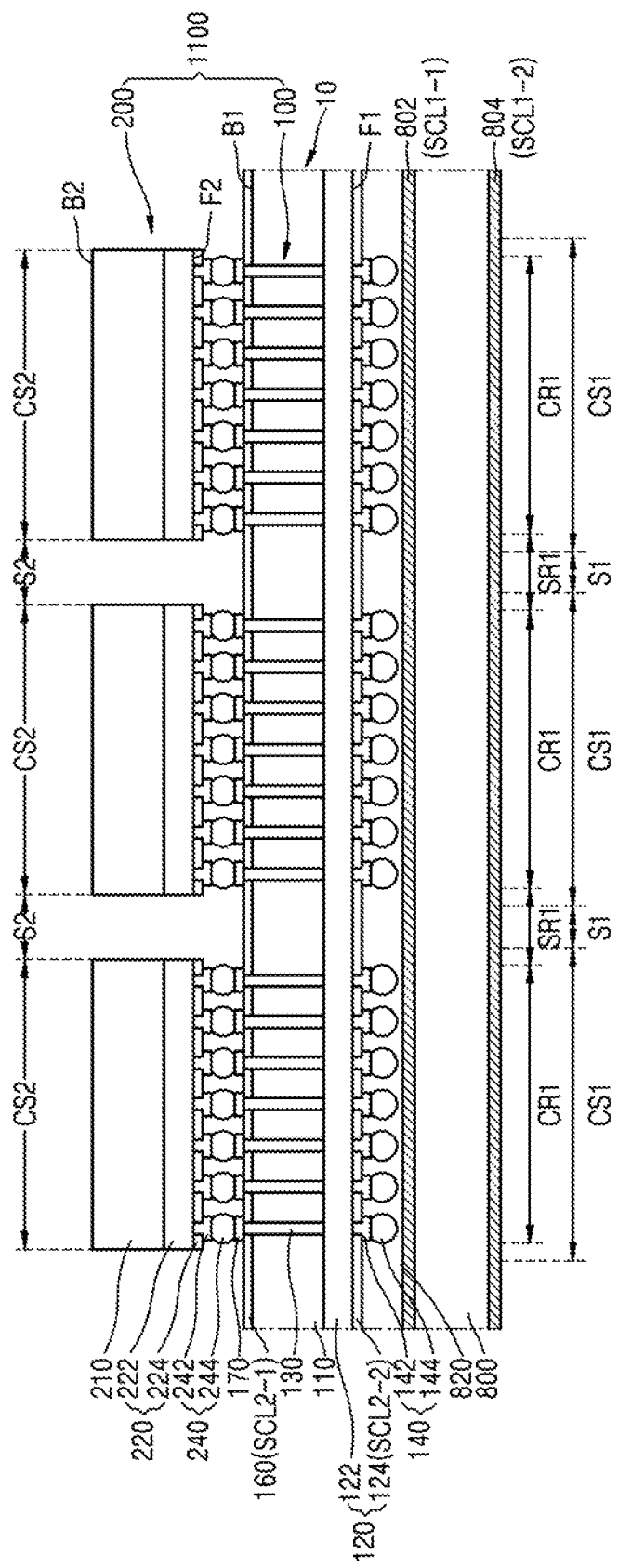

Referring to FIG. 7, a second chip 200 is prepared. The second chip 200 includes a body layer 210, a bottom insulation layer 220, and an internal connection member 240. The body layer 210 may include a silicon substrate (not shown), an integrated circuit layer (not shown) formed on the silicon substrate, and an interlayer insulation layer (not shown) covering the integrated circuit layer.

A rear surface B2 of the body layer 210 is exposed to the outside. The rear surface B2 of the body layer 210 is a surface facing a front surface F2 of a silicon substrate on which an integrated circuit layer is formed. The bottom insulation layer 220 is formed below the body layer 210 and includes an inter-metal insulation layer 222 and a passivation layer 224. A multilayer wiring pattern (not shown) may be formed inside the inter-metal insulation layer 222.

The internal connection member 240 includes a bump pad 242 and a bump 244. The bump pad 242 may be formed of a conductive material on the passivation layer 224 and may be electrically connected to the multilayer wiring pattern in the bottom insulation layer 220. An under bump metal (UBM) (not shown) may be formed on the bump pad 242. The bump pad 242 may be formed of a material which is the same as or different from that of the bump pad 142 of the external connection member 140 described above via an operation which is the same as or different from that for forming the bump pad 142.

The bump 244 is formed on the bump pad 242. The bump 244 may be formed of a conductive material including, e.g., copper (Cu), aluminum (Al), gold (Au), solder, etc. However, materials for forming the bump 244 are not limited thereto. In an exemplary embodiment, the bump 144 and the bump 244 may be formed of substantially the same material.

A TSV penetrating through the body layer 210 need not be formed in the second chip 200. Therefore, no top pad may be formed.

Stacked chips 1100 are formed by stacking the second chips 200 on the top surfaces of the first chips 100, respectively. Therefore, the chips 100 formed at the base wafer 10 may be referred to as the first chips 100. The second chip 200 is stacked onto the first chip 100 by adhering the internal connection member 240 of the second chip 200 onto the top pad 170 of the first chip 100 using a thermal pressing process. The internal connection member 240 may be connected to the top pad 170. Therefore, the multilayer wiring pattern of the second chip 200 may be electrically connected to the TSV 130 of the first chip 100.

If the internal connection member 240 of the second chip 200 is arranged at a location in correspondence to a location of the top pad 170 at the first chip 100, the second chip 200 is stacked onto the first chip 100. In an exemplary embodiment, the second chip 200 and the first chip 100 may be of a different type. In an exemplary embodiment, the second chip 200 and the first chip 100 may be of the same type.

The second chip 200s may be obtained by a same base wafer as shown in FIG. 5. In this case, no TSV may be formed in the second chips 200. However, in an exemplary embodiment, unlike in FIG. 7, TSVs may be formed in the second chips 200. In this case, the second chips 200 and the first chips 100 may both be obtained from the same base wafer.

Size of the second chip 200 may be indicated as size CS2. Size CS2 of the second chip 200 may be a width or a length. Each second chip 200 is spaced apart from other second chip 200 at a distance of size S2. The size S2 is greater than size S1. Since the size CS2 of the second chip 200 is smaller than the size CS1 of the first chip 100 and the size S2 is greater than the size S1, an underfill operation and a sawing operation may be performed later through a space between two adjacent second chips 200.

Figure 8:
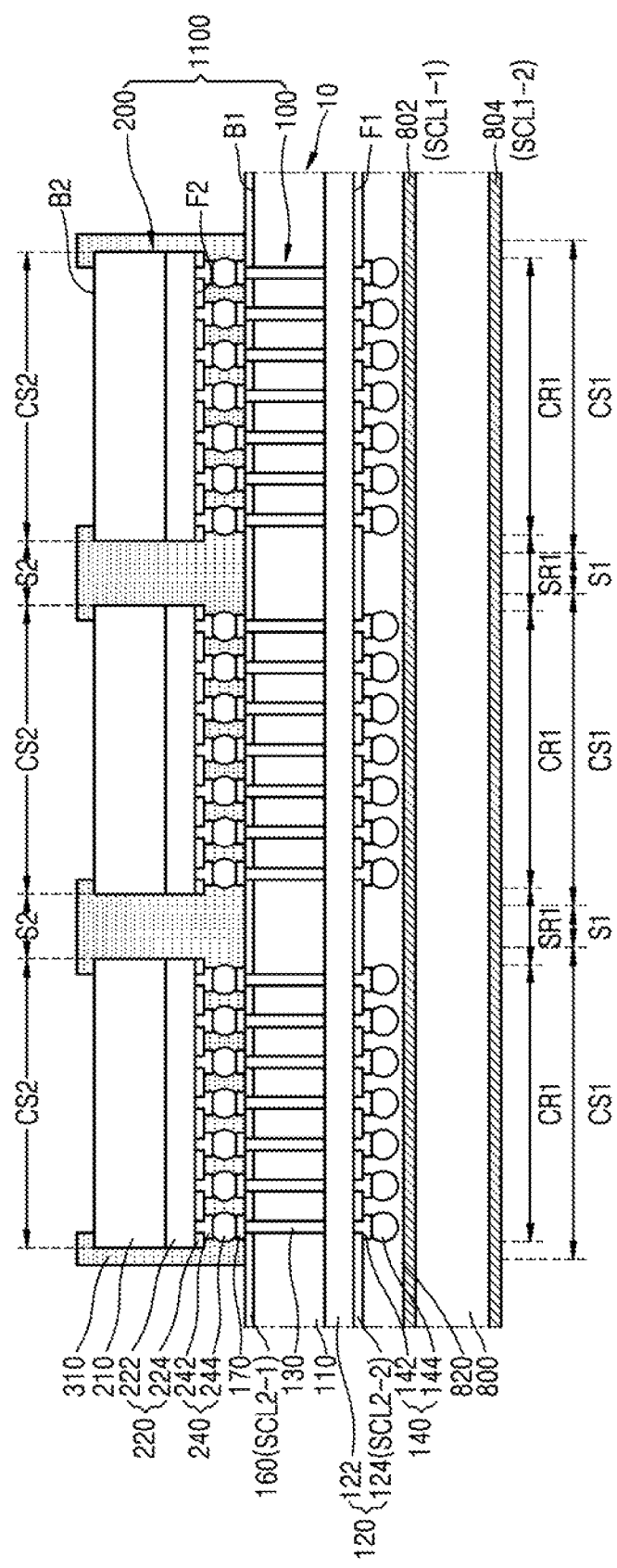

Referring to FIG. 8, an underfill 310 is formed as an encapsulation layer for filling the connecting portion between the first chip 100 and the second chip 200 of the stacked chip 1100. As described above, by reducing size of the second chip 200 stacked on the first chip 100, an underfill operation may be easily performed on a large-integration wafer even if size of a scribe line region, e.g., a width, is small. When the underfill 310 is formed, the warpage of the stacked chip 1100 or the base wafer 10 may be controlled by using the first stress controlling layer 802 (SCL1-1) for a carrier and the second stress controlling layer 804 (SCL1-2) for a carrier formed on the front surface and the rear surface of the supporting carrier 800.

The underfill 310 fills the connecting portion between the first chip 100 and the second chip 200, that is, a portion at which the top pad 170 of the first chip 100 is connected to the internal connection member 240. The underfill 310 may be formed of an underfill resin, such as epoxy resin, and may contain silica or flux. The underfill 310 may be formed of a material different from or same as that of a molding member described below.

As shown in FIG. 8, the underfill 310 encapsulates (or seal) the connecting portion between the first chip 100 and the second chip 200, lateral surfaces of the second chip 200 and a portion of the top surface of the second chip 200 (the rear surface B2). In an exemplary embodiment, the underfill 310 may only fill the connecting portion between the first chip 100 and the second chip 200. In an exemplary embodiment, the underfill 310 may fill the connecting portion between the first chip 100 and the second chip 200 and surround the lateral surfaces of the second chip 200.

The underfill 310 may be formed to overlap an adjacent underfill 310. If the underfill 310 surrounds the lateral surfaces of the second chip 200, the underfill 310 formed on the lateral surfaces may be exposed in the completed semiconductor package. In case of performing a molded underfill (MUF) operation, the underfill operation described above may be omitted.

Figure 9:
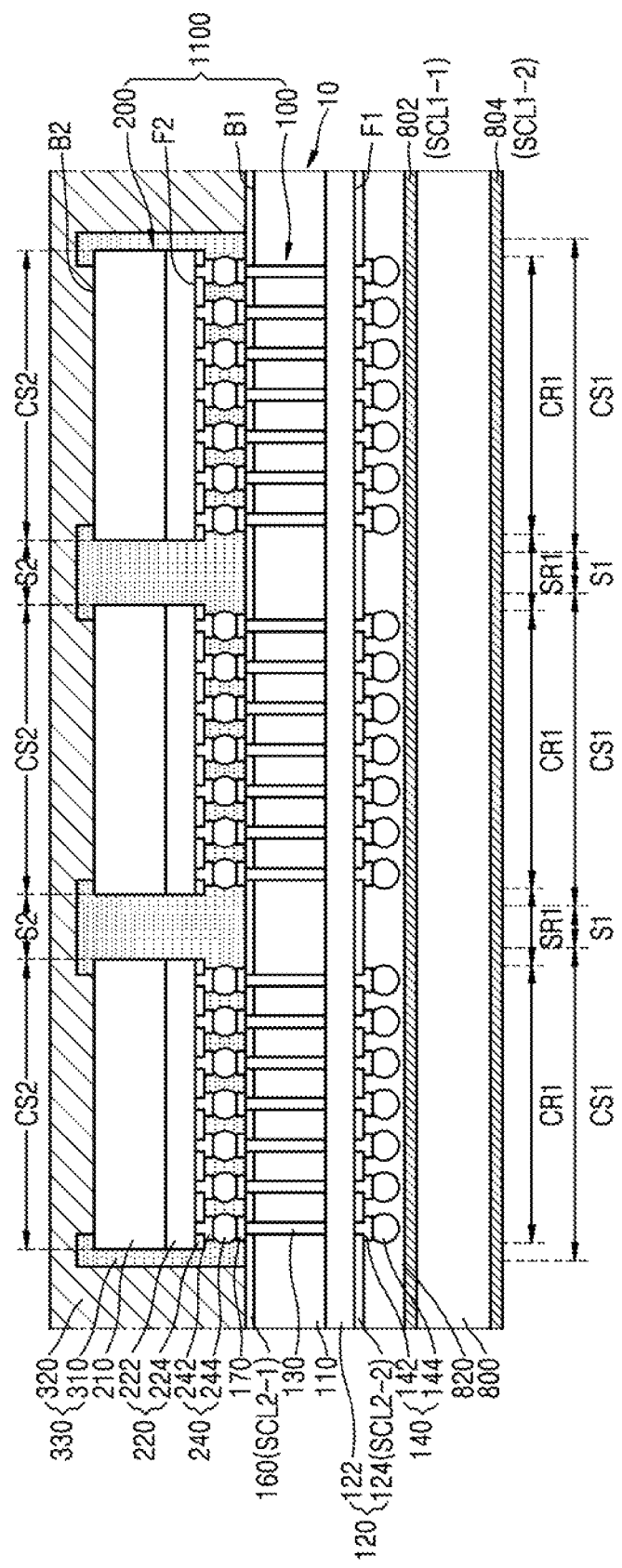

Referring to FIG. 9, a molding member 320 molds or covers the stacked chip 1100 which is adhered to the top of the supporting carrier 800. The molding member 320 may be formed of a polymer, such as a resin. For example, the molding member 320 may be formed of an epoxy molding compound (EMC). When the molding member 320 is formed on the resulting structure of FIG. 8, warpage of the stacked chip 1100 or the base wafer 10 caused by the formation of the molding member 320 may be controlled by using the first stress controlling layer 802 (SCL1-1) for a carrier and the second stress controlling layer 804 (SCL1-2) for a carrier formed on the front surface and the rear surface of the supporting carrier 800.

An encapsulation layer 330 including the underfill 310 and the molding member 320 is formed on the stacked chips 1100. The encapsulation layer 330 covers lateral surfaces and top surfaces (rear surfaces B2) of the first chip 100 and the second chip 200 of the stacked chips 1100. The molding member 320 encapsulates lateral surfaces of the underfill 310.

Figure 10:
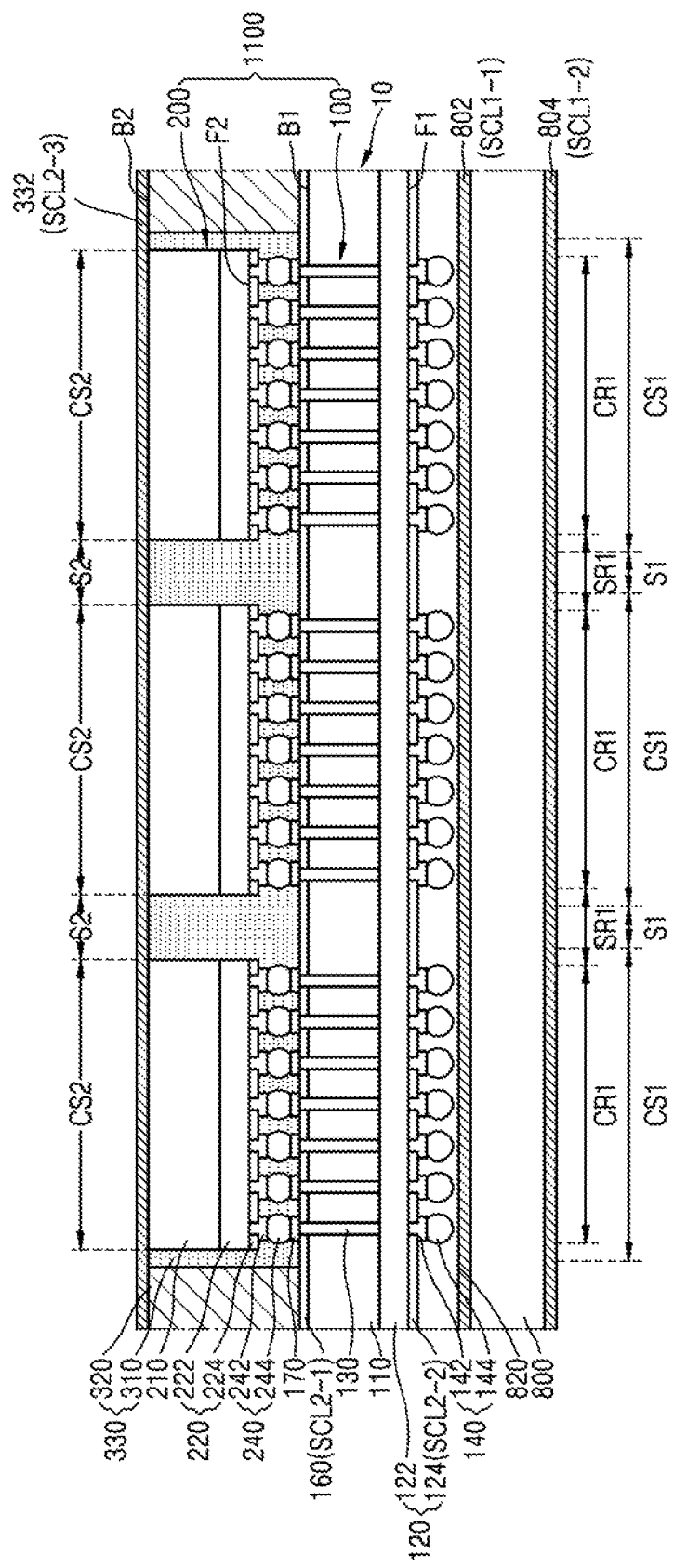

Referring to FIG. 10, the top surfaces of the second chips 200 (rear surfaces B2) of the stacked chips 1100 may be exposed by grinding the top surface of the encapsulation layer 330. The top surface of the encapsulation layer 330 may form a smooth horizontal or planarized surface with the top surface of the second chip 200 (the rear surface B2). If no TSV is formed at the second chip 200, the top surface of the second chip 200 may be the rear surface B2 of a semiconductor substrate (for example, a silicon substrate) without an integrated circuit layer, and thus silicon on the rear surface B2 of the semiconductor substrate may be exposed to the outside.

A third stress controlling layer 332 (SCL2-3) for a package is formed on the top surface of the second chip 200 and the top surface of the encapsulation layer 330. The third stress controlling layer 332 (SCL2-3) for a package may be formed to adjust (or control) warpage of the stacked chip 1100 or the base wafer 10 that may occur after the encapsulation layer 330 is formed. The third stress controlling layer 332 (SCL2-3) for a package may be formed of an oxide layer, a nitride layer, a polymer layer, or a combination thereof.

Figure 11:
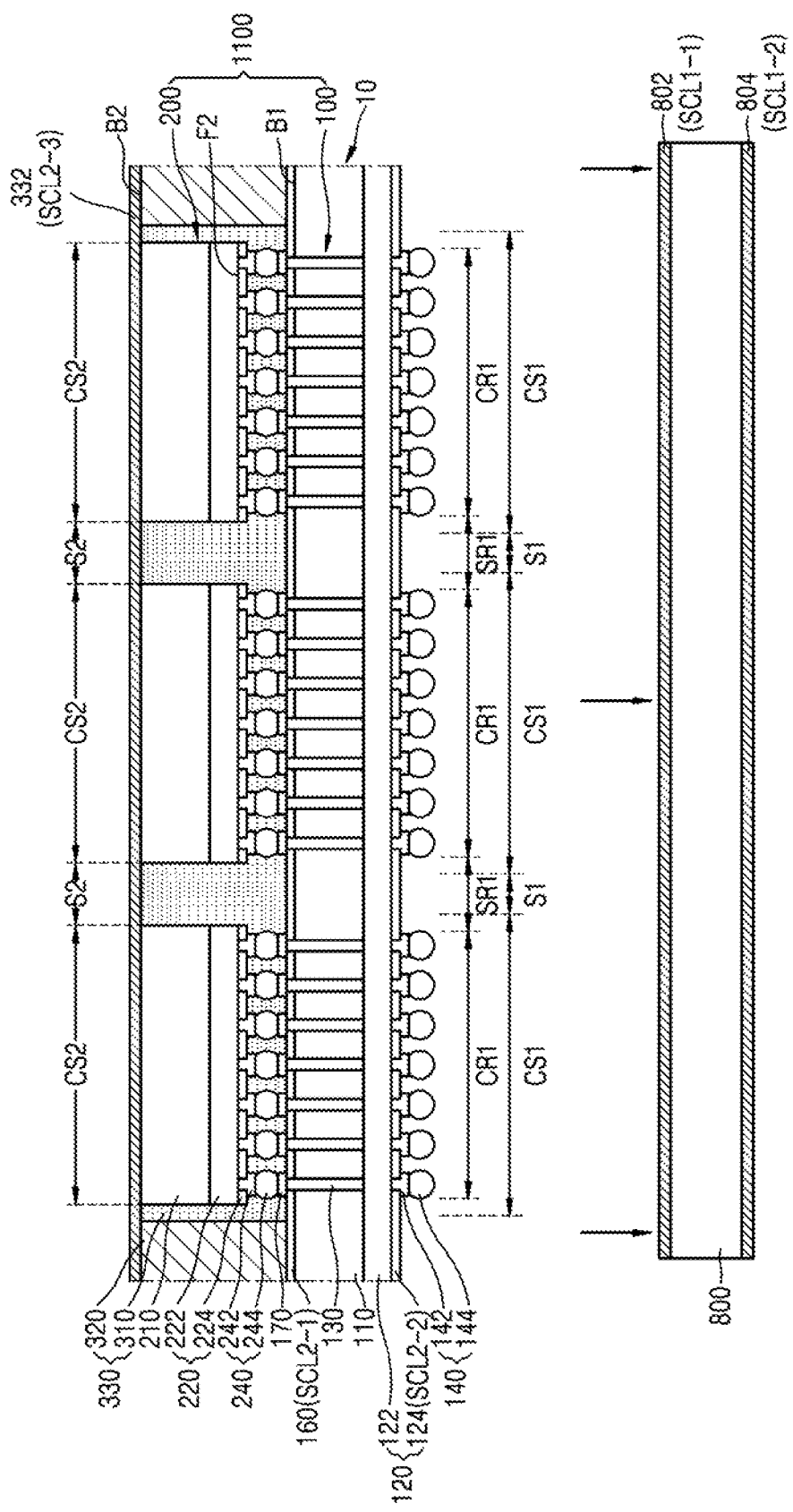

Referring to FIG. 11, the adhering member 820 is removed from the base wafer 10, and the supporting carrier 800 on which the first and the second stress controlling layers 802 and 804 are formed is separated from the base wafer 10. The external connection members 140 of the first chips 100 of the stacked chips 1100 may be exposed to the outside.

In an exemplary embodiment, the supporting carrier 800, the first and the second stress controlling layers 802 and 804 for a carrier, and the adhering member 820 may be removed separately. In an exemplary embodiment, the combined structure of the supporting carrier 800, the first and the second stress controlling layers 802 and 804 for a carrier, and the adhering member 820 may be simultaneously removed. For example, if the supporting carrier 800 may be formed of a transparent material, e.g., a glass substrate and if the adhering member 820 is formed of an UV film, the supporting carrier 800 and the adhering member 820 may be simultaneously separated from the base wafer 10 by irradiating UV rays thereto.

Figure 12:
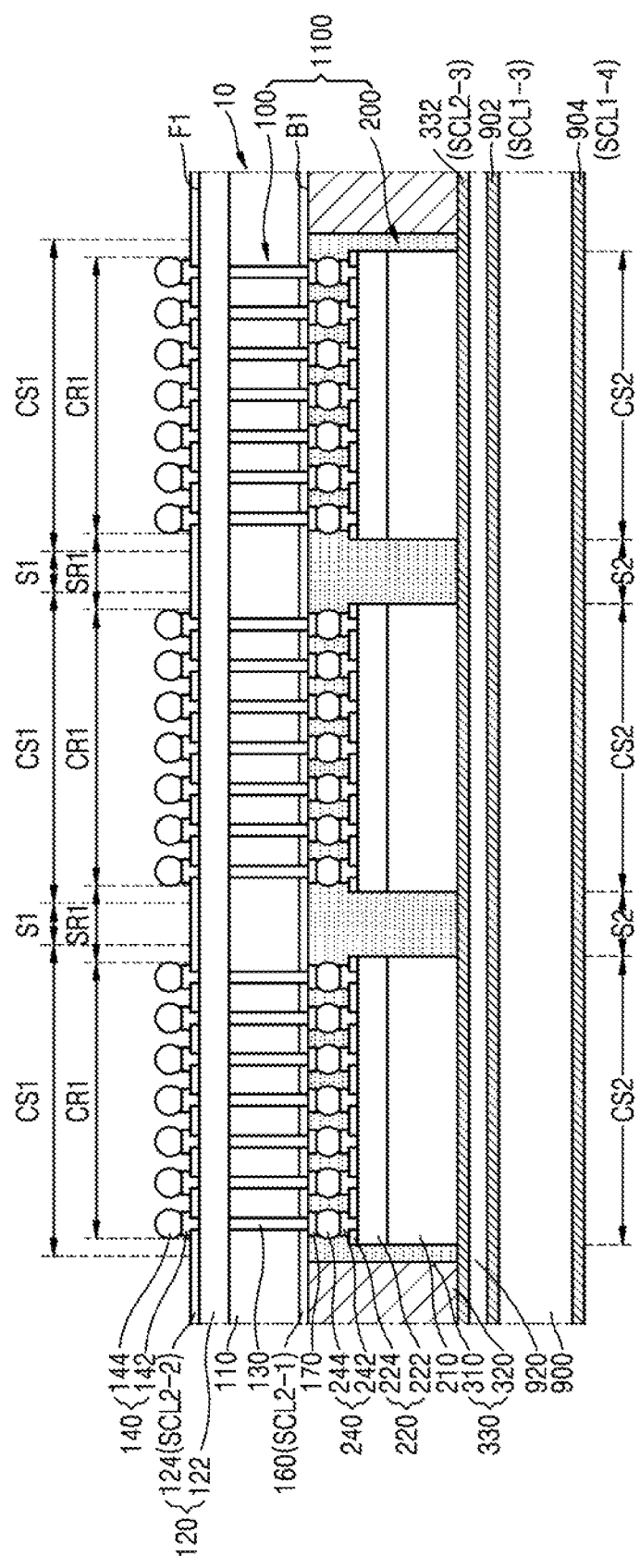

Referring to FIG. 12, the base wafer 10 to which the stacked chips 1100 are attached is turned upside down, and a supporting carrier 900 is attached thereto. A third stress controlling layer 902 (SCL1-3) for a carrier and a fourth stress controlling layer 904 (SCL1-4) for a carrier are formed on the front surface and the rear surface of the supporting carrier 900. The third stress controlling layer 902 (SCL1-3) for a carrier and the fourth stress controlling layer 904 (SCL1-4) for a carrier may adjust (control) warpage of the stacked chips 1100 or the base wafer 10.

The supporting carrier 900 may be formed of silicon, germanium, silicon-germanium, gallium-arsenic (GaAs), glass, metal, plastic, or ceramic. An adhering member 920 may be formed of a non-conductive film (NCF), an anisotropic conductive film (ACF), an UV film, an instant glue, a heat hardening adhesive, a laser hardening adhesive, an ultrasound hardening adhesive, a non-conductive paste (NCP), etc.

According to an exemplary embodiment of the present embodiment, the supporting carrier 900 may be formed of a glass substrate, and the adhering member 920 may be formed of an UV film. The third stress controlling layer 902 (SCL1-3) for a carrier and the fourth stress controlling layer 904 (SCL1-4) for a carrier may be formed of the same material as the first stress controlling layer 802 (SCL1-1) for a carrier and the second stress controlling layer 804 (SCL1-2) for a carrier described above. The third stress controlling layer 902 (SCL1-3) for a carrier and the fourth stress controlling layer 904 (SCL1-4) for a carrier may be formed of different types of materials.

Figure 13:
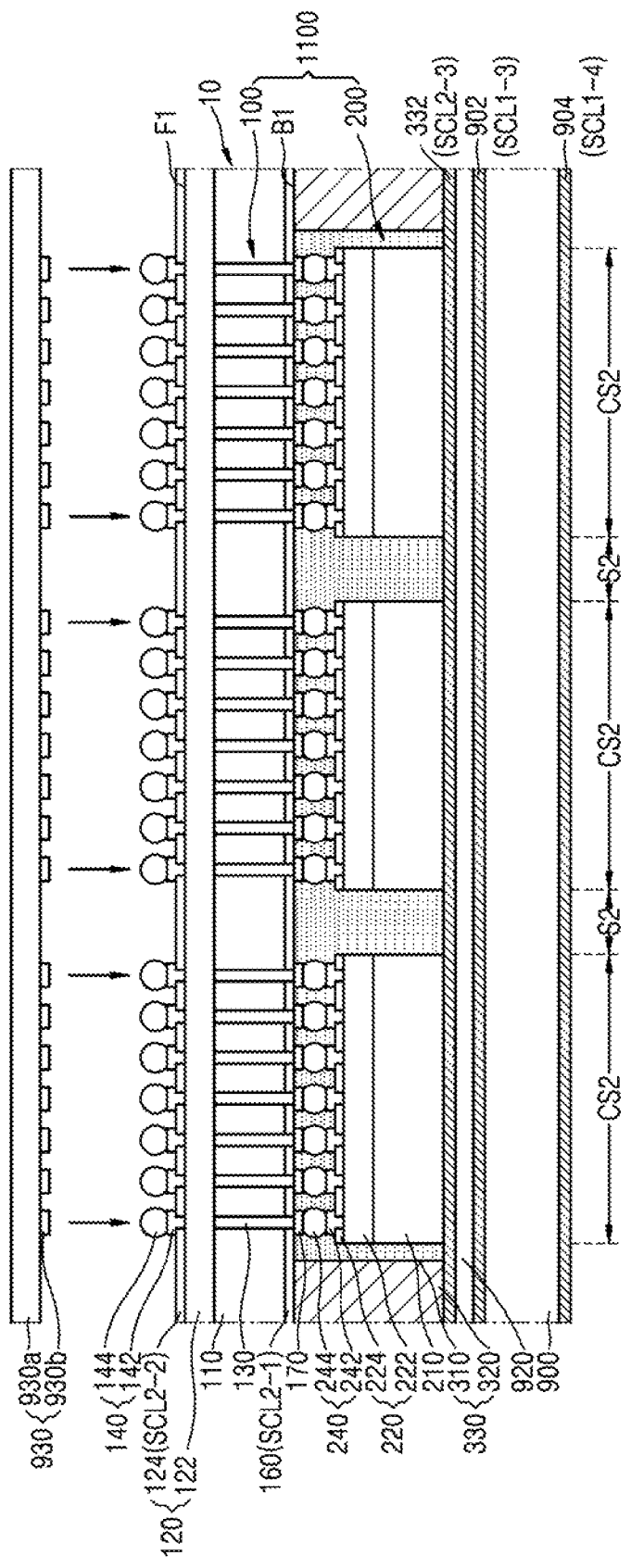

Referring to FIG. 13, an electrical die sorting (EDS) test is performed with respect to the respective stacked chips 1100 by using the supporting carrier 900. The EDS test may be performed by using a probe card 930, for example. The probe card 930 includes a body unit 930a and a terminal pin 930b. The terminal pin 930b may be pogo pins, for example. In the EDS test, the pogo pins are electrically connected to the corresponding external connection members 140 to apply electric signals from a test equipment to the stacked chips 110.

Good or defectiveness of the stacked chips 1100 is determined via an EDS test. The stacked chips 1100 are determined as good or defective via the EDS test, and defective stacked chips 1100 are discarded. Therefore, a final semiconductor package according to an exemplary embodiment of the present embodiment is a package formed of stacked chips that have passed an EDS test. Therefore, a final semiconductor package according to an exemplary embodiment may be referred to as a known good die stack (KGDS).

Figure 14:
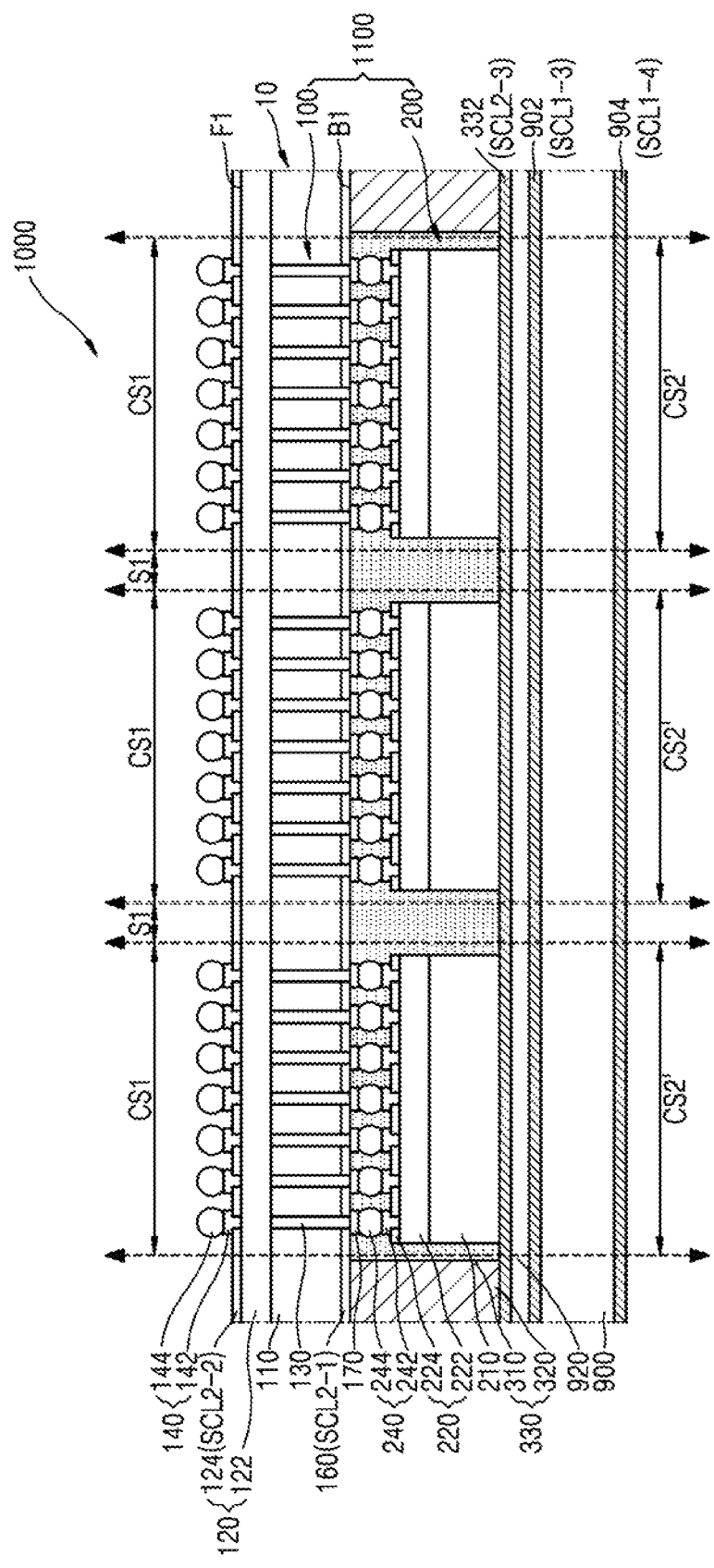

Referring to FIG. 14, after an EDS test, the base wafer 10 and the encapsulation layer 330 are sawed and separated to respective semiconductor packages 1000. The adhering member 920 may be partially removed via a sawing operation. The base wafer 10 and the encapsulation layer 330 may be sawed so that the first chip 100 has the size CS1. Since the base wafer 10 and the encapsulation layer 330 between the second chips 200 may be sawed to form the first chip 100 having the width CS1. The base wafer 10 and the encapsulation layer 330 between the second chips 200 may be sawed through a blade width S1 smaller than a blade width S2 as defined in FIG. 10. In this case, the second chip 200 including the encapsulation layer 330 (that is, the underfill 310) may have a size CST greater than the size CS2 as defined in FIG. 13. The difference between the size CS2 and the size CS2' may be determined by the blade width S1.

Figure 15:
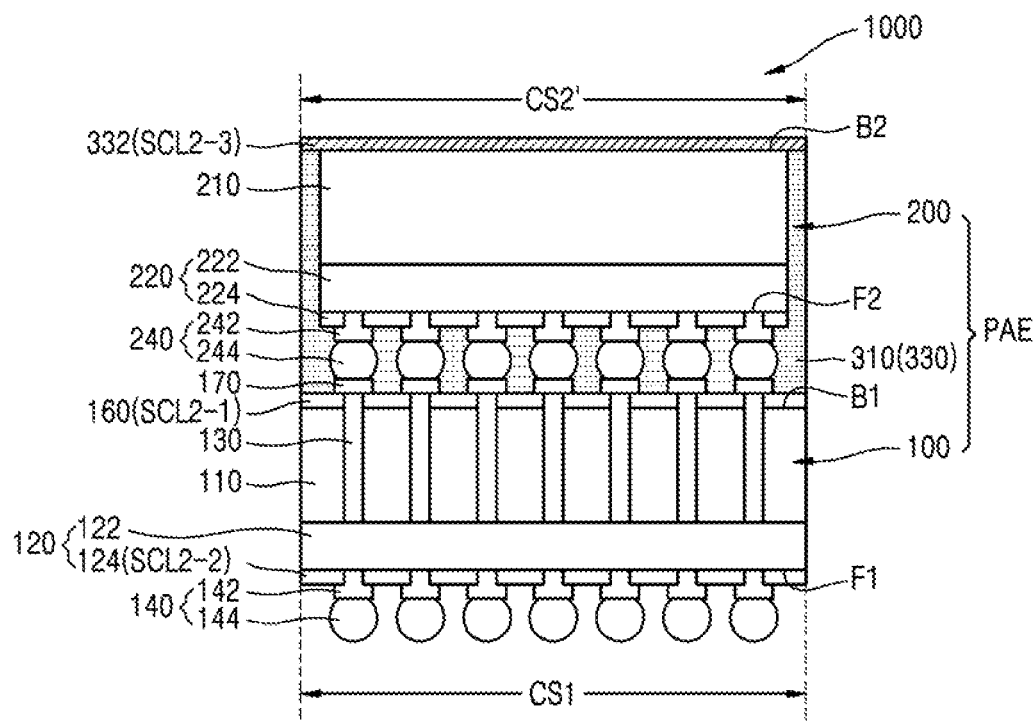

Referring to FIG. 15, the semiconductor packages 1000 are completed by removing the supporting carrier 900 and the adhering member 920 from the respective semiconductor chips which are cut away in FIG. 14. The supporting carrier 900 and the adhering member 920 may be removed sequentially or simultaneously. As described above, after the semiconductor packages 1000 are formed via a sawing operation, two lateral surfaces of the first chip 100 may be exposed. In this case, when the semiconductor package 1000 is mounted on a circuit board substrate and molded again, an additional molding member may be attached to the lateral surfaces of the first chip 100 well.

According to the method of fabricating a semiconductor package according to the present embodiment, warpage of the base wafer 10 may be controlled by forming the first stress controlling layer 160 (SCL2-1) for a package and the second stress controlling layer 124 (SCL2-2) for a package respectively formed on the front surface and the rear surface of the first chip 100.

According to the method of fabricating a semiconductor package according to the present embodiment, when the encapsulation layer 330 including the underfill 310 and the non-molding member 320 is formed, warpage of the stacked chip 1100 or the base wafer 10 may be controlled by using the first stress controlling layer 802 (SCL1-1) for a carrier and the second stress controlling layer 804 (SCL1-2) for a carrier respectively formed on the front surface and the rear surface of the supporting carrier 800.

According to the method of fabricating a semiconductor package according to the present embodiment, warpage of the stacked chip 1100 or the base wafer 10 may be controlled by using the third stress controlling layer 902 (SCL1-3) for a carrier and the fourth stress controlling layer 904 (SCL1-4) for a carrier respectively formed on the front surface and the rear surface of the supporting carrier 900, for an EDS test.

According to the method of fabricating a semiconductor package according to the present embodiment, the third stress controlling layer 332 (SCL2-3) for a package formed on a surface of the second chip 200 and a surface of the encapsulation layer 330 may control warpage of the stacked chip 1100 or the base wafer 10 after the formation of the encapsulation layer 330.

According to the method of fabricating a semiconductor package according to the present embodiment, an electrical die sorting (EDS) test is performed after the stacked chips 1100 are mounted on the base wafer 10 including a plurality of first chips 100 having formed therein the TSVs 130. Therefore, the stacked chips 1100 determined as good or defective may be obtained without a PCB or an interposer.

Here, referring back to FIG. 15, structure and characteristics of the semiconductor package 1000 fabricated by using the method of fabricating a semiconductor package will be briefly described.

In detail, the semiconductor package 1000 includes the package element PAE, which includes the first chip 100, the second chip 200, and the underfill 310 that encapsulates the first chip 100 and the second chip 200. The stress controlling layer 332 (SCL2-3) for a package may be formed on a surface B2 of the package element PAE.

The package element PAE may have a first warpage during the above-stated fabrication process, and the first warpage of the package element PAE may be cancelled by the stress controlling layer 332 (SCL2-3) for a package which may be formed on the surface B2 of the package element PAE. In this case, the stress controlling layer 332 may have a second warpage to offset the first warpage. For example, the first warpage of the package element PAE has a positive value, and the second warpage of the third stress controlling layer 332 (SCL2-3) for a package may have a negative value opposite to the value of the first warpage. For example, the first warpage of the package element PAE has a negative value, and the second warpage of the third stress controlling layer 332 (SCL2-3) for a package may have a positive value opposite to the value of the first warpage.

The semiconductor package 1000 includes the first chip 100, the second chip 200, and the underfill 310, and the good stacked chip 1100 may be obtained therefrom. The first chip 100 includes the body layer 110, the bottom insulation layer 120, the TSV 130, the external connection member 140, the first stress controlling layer 160 (SCL2-1) for a package, the second stress controlling layer 124 (SCL2-2) for a package, and the top pad 170. At the bottom of the first chip 100, the bump 144 is exposed to the outside.

The second chip 200 includes the body layer 210, the bottom insulation layer 220, the internal connection member 240, and the third stress controlling layer 332 (SCL2-3) for a package. The second chip 200 need not include a TSV or, if necessary, may include a TSV. An active surface (the front surface F2) of the second chip 200 is mounted on a non-active surface (the rear surface B1) of the first chip 100 and constitute a stacked chip, where the internal connection member 240 is connected to the top pad 170 of the first chip 100. Therefore, the second chip 200 is electrically connected to the TSV 130 of the first chip 100 via the internal connection member 240.

The underfill 310 of the encapsulation layer 330 fills the connecting portion between the first chip 100 and the second chip 200, that is, the connecting portion between the top pad 170 of the first chip 100 and the internal connection member 240. The encapsulation layer 330 is formed to surround two lateral surfaces of the second chip 200. Therefore, the encapsulation layer 330 formed on two surfaces of the second chip 200 and the encapsulation layer 330 formed at the connecting portion between the first chip 100 and the second chip 200 may be formed of the same material.

On the top surface (the rear surface B2) of the second chip 200, the third stress controlling layer 332 (SCL2-3) for a package is formed instead of the encapsulation layer 330. No encapsulation layer is formed on the two lateral surfaces of the first chip 100 and the two lateral surfaces of the first chip 100 are exposed. Therefore, when the semiconductor package 1000 is mounted on a circuit board substrate and molded again, an additional molding member may be attached to the lateral surfaces of the first chip 100 well.

Two end portions of the encapsulation layer 330 formed to surround two lateral surfaces of the second chip 200 vertically match an edge portion of the first chip 100. For example, size CS2' of the second chip 200 including the encapsulation layer 330 may be identical to the size CS1 of the first chip 100.

Figure 16:
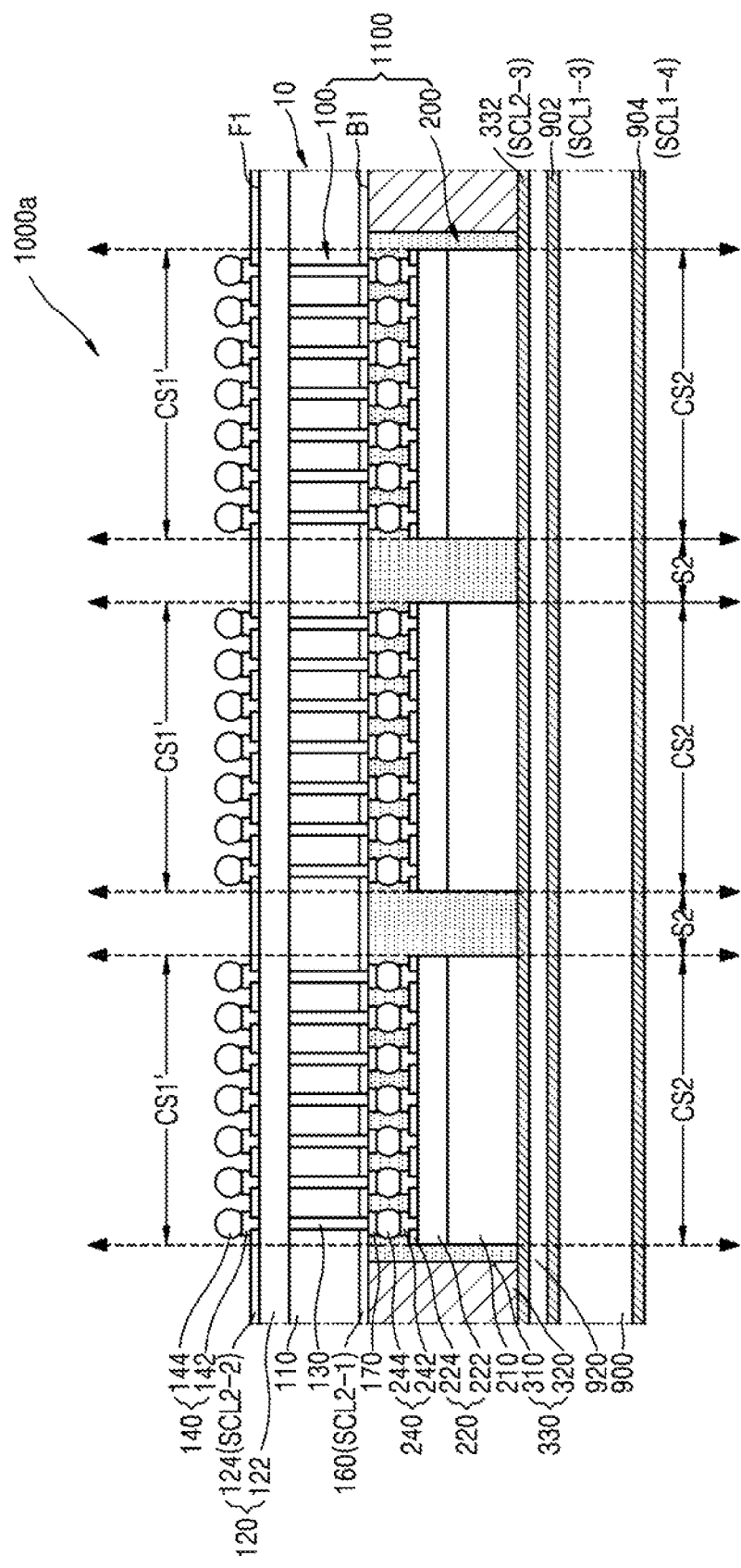
FIGS. 16 and 17 are sectional view diagrams for describing a semiconductor package according to an exemplary embodiment and a method of fabricating the same.
Figure 17:
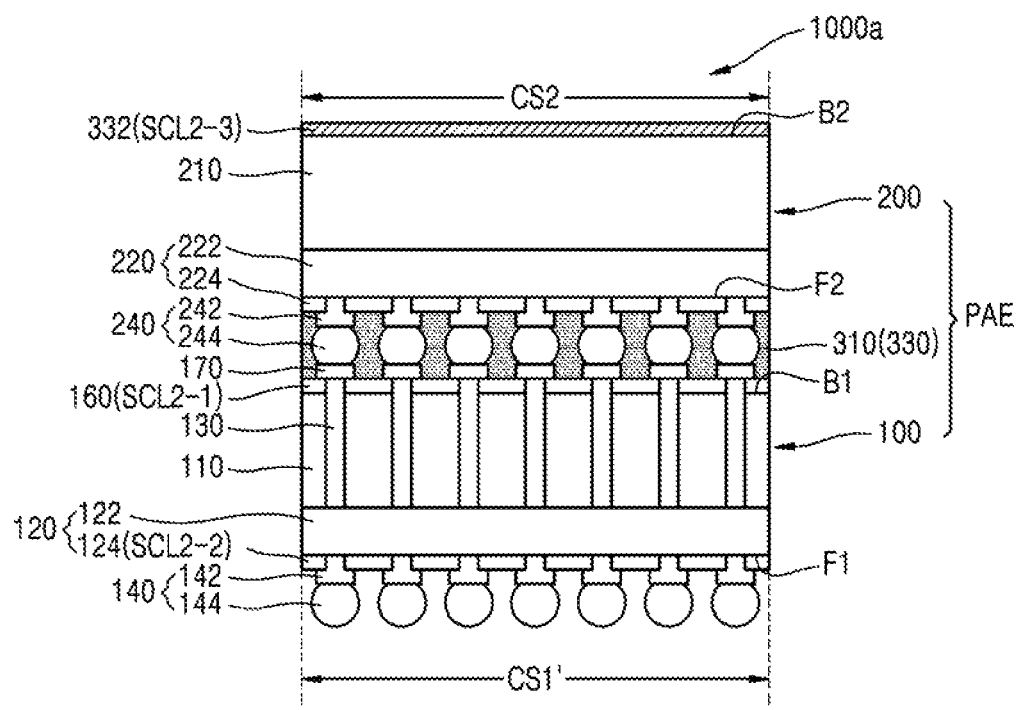

FIGS. 16 and 17 are sectional view diagrams for describing a semiconductor package according to an exemplary embodiment and a method of fabricating the same.

The embodiment shown in FIGS. 16 and 17 may be identical to the embodiment shown in FIG. 15 except operations for sawing the base wafer 10 and the encapsulation layer 330.

First, the fabricating process of FIGS. 5 to 13 is performed. As a result, the plurality of second chips 200 encapsulated by the encapsulation layer 330 are arranged on the supporting carrier 900. The third stress controlling layer 902 (SCL1-3) for a carrier and the fourth stress controlling layer 904 (SCL1-4) for a carrier are formed on the supporting carrier 900. The base wafer 10 including the first chips 100 is attached onto the second chips 200.

Referring to FIG. 16, the base wafer 10 and the encapsulation layer 330 are sawed so that the second chip 200 has the width CS2. The base wafer 10 may be sawed using a blade with a blade width S2. In this case, size of the first chip 100 is slightly reduced from size CS1 to size CS1'.

Referring to FIG. 17, semiconductor packages 1000' are completed by removing the supporting carrier 900, the third stress controlling layer 902 (SCL1-3) for a carrier, the fourth stress controlling layer 904 (SCL1-4) for a carrier and the adhering member 920. The supporting carrier 900 and the adhering member 920 may be removed sequentially or simultaneously. As described above, after the semiconductor packages 1000a are formed via a sawing operation, two lateral surfaces of each of the first chip 100 and the second chip 200 may be exposed.

According to the method of fabricating a semiconductor package shown in FIGS. 16 and 17, the top surface of the second chip 200 and two lateral surfaces of the first chip 100 are exposed. In this case, when the semiconductor package 1000 is mounted on a circuit board substrate and molded again, an additional molding member may be attached to the lateral surfaces of the first chip 100 and the second chip 200 well Here, referring to FIG. 17, structure and characteristics of the semiconductor package 1000a fabricated by using the method of fabricating a semiconductor package will be briefly described.

The semiconductor package 1000a includes the package element PAE, which includes the first chip 100, the second chip 200, and the encapsulation layer 330 that encapsulates the first chip 100 and the second chip 200. The stress controlling layer 332 (SCL2-3) for a package is formed on a surface B2 of the package element PAR The package element PAE may have a first warpage during the above-stated fabrication process, but the stress controlling layer 332 (SCL2-3) for a package may be formed on the surface B2 of the package element PAE to have a second warpage for offsetting the first warpage. For example, the first warpage of the package element PAE has a positive value or a negative value, and the second warpage of the third stress controlling layer 332 (SCL2-3) for a package may have a negative value or a positive value opposite to the value of the first warpage.

The semiconductor package 1000a of FIG. 17 may be identical to the semiconductor package 1000 of FIG. 15 except that two lateral surfaces of the second chip 200 are exposed. The encapsulation layer 330 fills the connecting portion between the first chip 100 and the second chip 200, that is, the connecting portion between the top pad 170 of the first chip 100 and the internal connection member 240, but the encapsulation layer 330 are not formed on the two lateral surfaces of the second chip 200. Furthermore, the encapsulation layer 330 is not formed on the two lateral surfaces of the first chip 100, and thus the two lateral surfaces of the first chip 100 are exposed.

Therefore, when the semiconductor package 1000 is mounted on a circuit board substrate and molded again, an additional molding member may be attached to the lateral surfaces of the first chip 100 and the top surface of the second chip 200 well. Furthermore, two end portions of the second chip 200 vertically match an edge portion of the first chip 100. For example, the size CS2 of the second chip 200 is identical to the size CS1 of the first chip 100.

Figure 18:
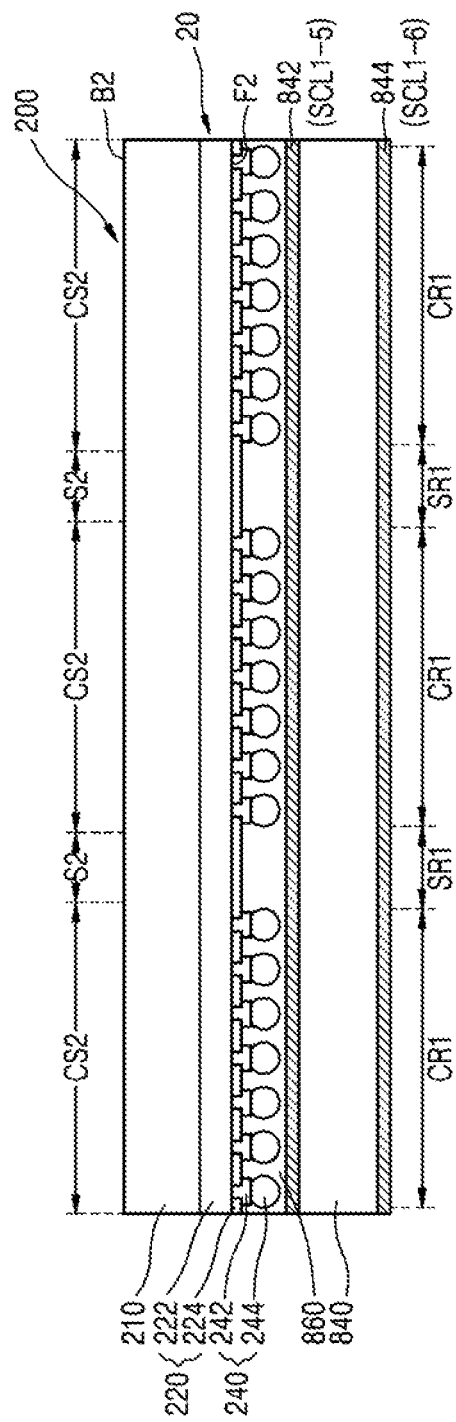
FIGS. 18 and 19 are sectional view diagrams for describing a method of fabricating a second chip used in a method of fabricating a semiconductor package according to an exemplary embodiment.
Figure 19:
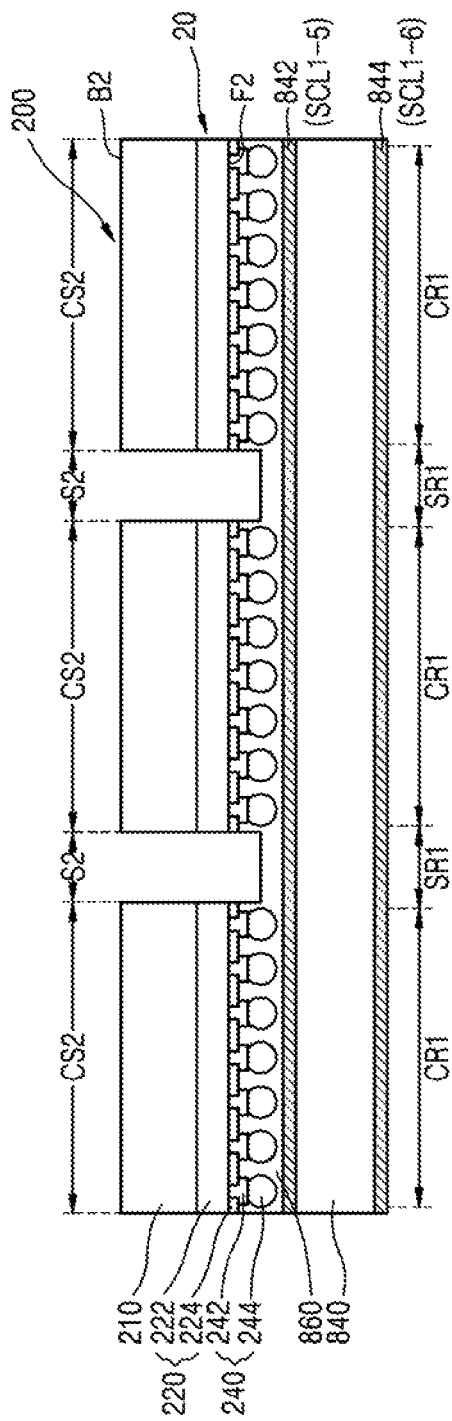

FIGS. 18 and 19 are sectional view diagrams for describing a method of fabricating a second chip used in a method of fabricating a semiconductor package according to an exemplary embodiment.

Referring to FIG. 18, a wafer 20 including a plurality of second chips 200 is prepared. The wafer 20 is attached to a supporting carrier 840 using an adhering member 860. A fifth stress controlling layer 842 (SCL1-5) for a carrier and a sixth stress controlling layer 844 (SCL1-6) for a carrier are formed on the front surface and the rear surface of the supporting carrier 840. The fifth stress controlling layer 842 (SCL1-5) for a carrier and the sixth stress controlling layer 844 (SCL1-6) for a carrier may adjust (control) warpage of the wafer 20.

In the wafer 20, size of a chip region is indicated as size CR1 like the first chip 100. The size CR1 of the chip region may be a width or a length. Size of a scribe line between the chips 100 is also indicated as a size SR1 like the first chip 100. The size SR1 of a scribe line may be a width or a length.

As described above, the supporting carrier 840 may be formed of silicon, germanium, silicon-germanium, gallium-arsenic (GaAs), a glass, a metal, a plastic, or a ceramic. The adhering member 860 may be formed of a non-conductive film (NCF), an anisotropic conductive film (ACF), an UV film, an instant glue, a heat hardening adhesive, a laser hardening adhesive, an ultrasound hardening adhesive, a non-conductive paste (NCP), etc. The wafer 20 may be adhered, such that the internal connection member 240 faces the supporting carrier 840.

Referring to FIG. 19, the wafer 20 is separated to the respective second chips 200 by sawing the wafer 20 along scribe line regions. The size of the second chip 200 completed by sawing the wafer 20 may be indicated as size CS2. The size CS2 of the second chip 200 may be a width or a length. The size sawed by a blade in a scribe line region is indicated as size S2. The size S2 sawed by a blade in a scribe line region may be width of the blade.

Figure 20:
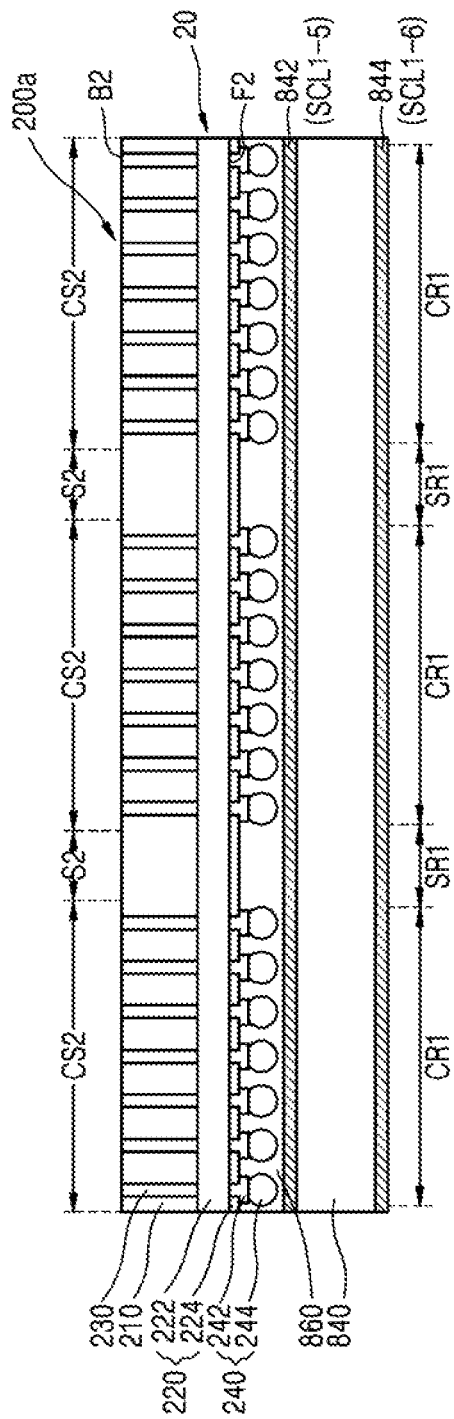
FIGS. 20 and 21 are sectional view diagrams for describing a method of fabricating a second chip used in a method of fabricating a semiconductor package according to an exemplary embodiment.
Figure 21:
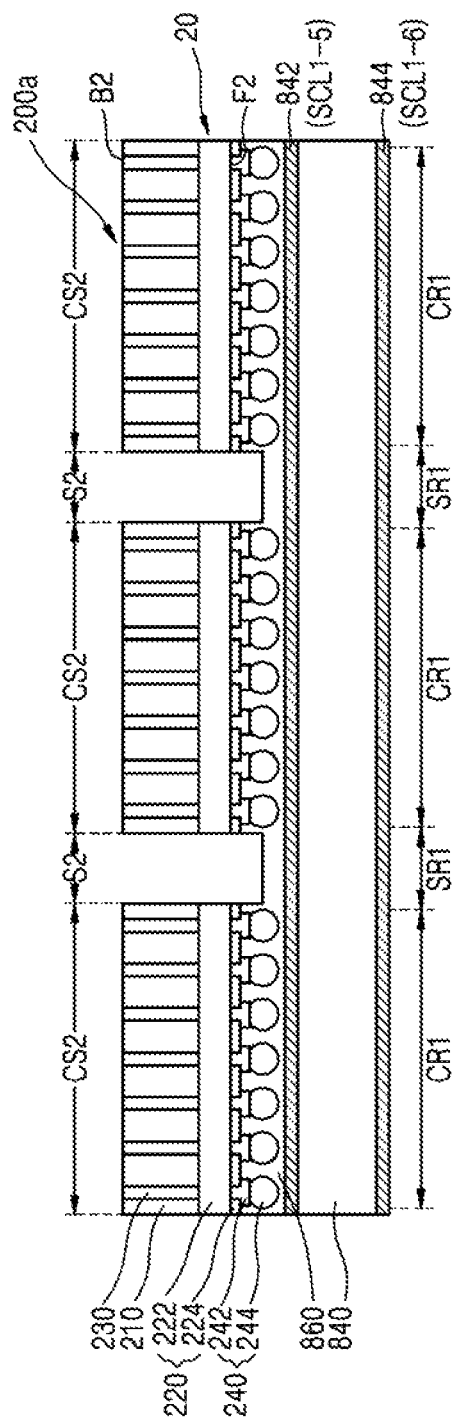

FIGS. 20 and 21 are sectional view diagrams for describing a method of fabricating a second chip used in a method of fabricating a semiconductor package according to an exemplary embodiment.

In detail, a second chip 200a shown in FIGS. 20 and 21 may be identical to the second chip 200 of FIGS. 18 and 19 except that a TSV 230 is formed.

Referring to FIG. 20, the wafer 20 including a plurality of second chips 200a having formed therein the TSVs 230 is prepared. The wafer 20 is attached to the supporting carrier 840 using the adhering member 860.

Referring to FIG. 21, the wafer 20 is separated to the respective second chips 200a by sawing the wafer 20 along scribe line regions. The size of the second chip 200a completed by sawing the wafer 20 may be indicated as size CS2. The size CS2 of the second chip 200a may be a width or a length. The size sawed by a blade in a scribe line region is indicated as size S2. The size S2 sawed by a blade in a scribe line region may be width of the blade.

Figure 22:
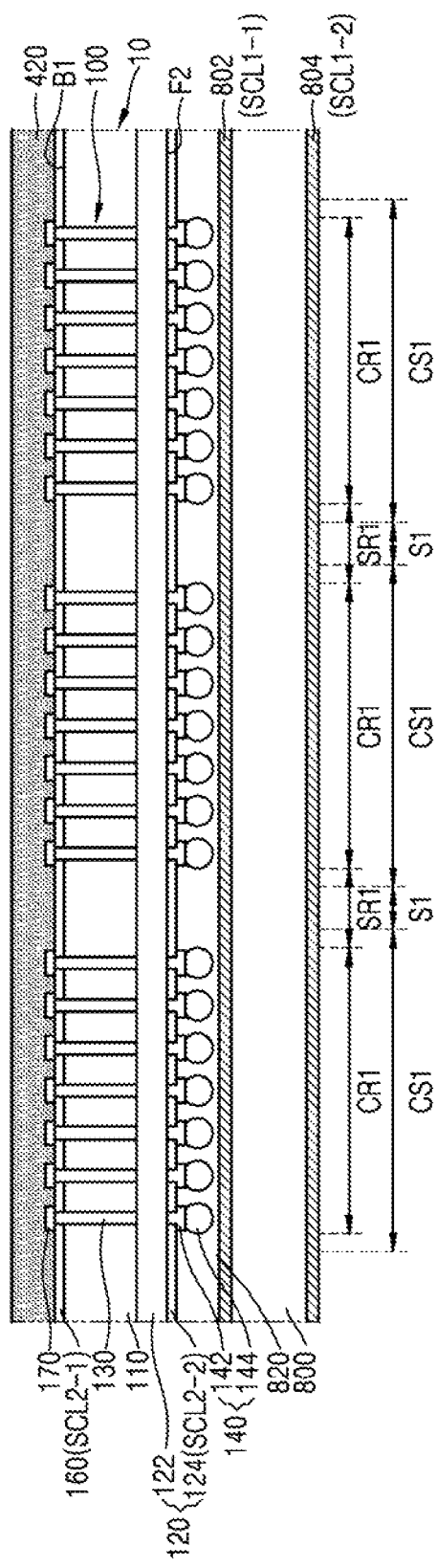
FIGS. 22 and 23 are sectional view diagrams for describing a method of fabricating a semiconductor package according to an exemplary embodiment.
Figure 23:
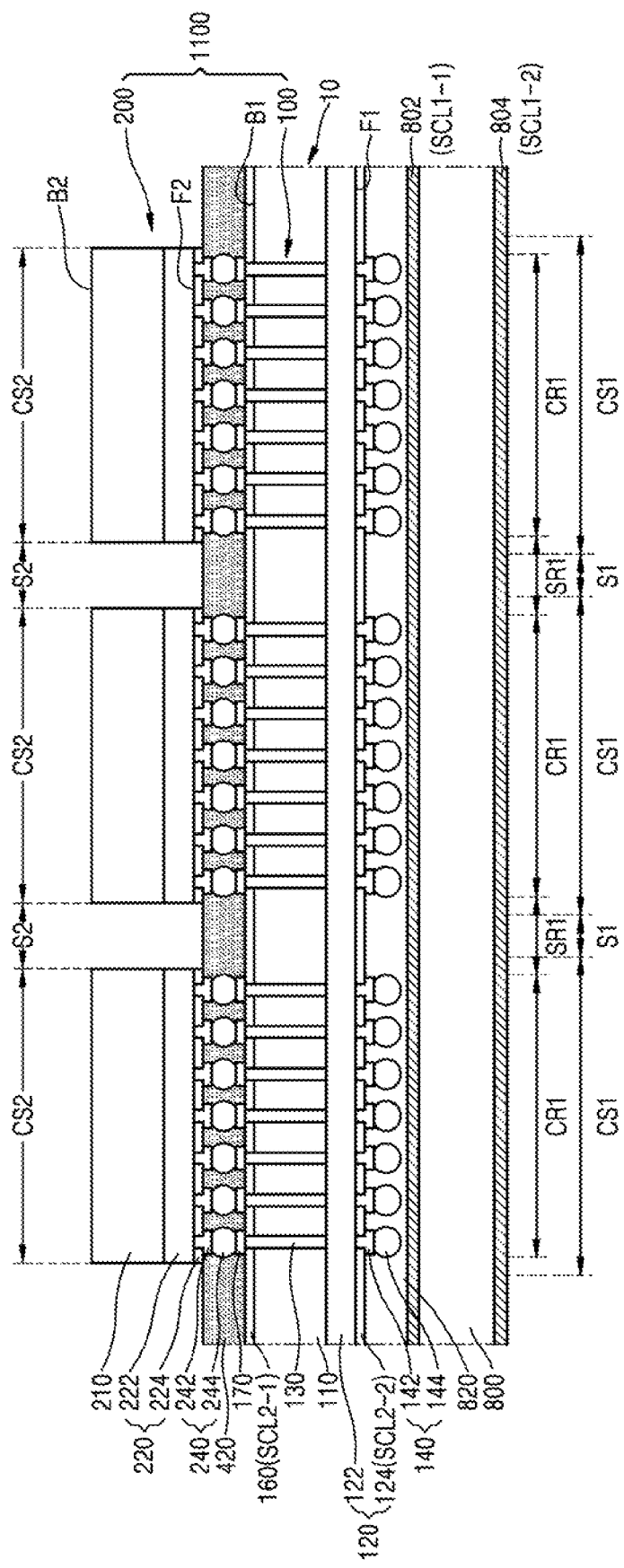

FIGS. 22 and 23 are sectional view diagrams for describing a method of fabricating a semiconductor package according to an exemplary embodiment.

In detail, the embodiment shown in FIGS. 22 and 23 is identical to the previous exemplary embodiments except that an adhering member 420 is formed on the base wafer 10. In this case, the underfill 310 of the previous exemplary embodiments need not be formed.

Referring to FIG. 22, the adhering member 420 that covers the first stress controlling layer 160 (SCL2-1) for a package and the second stress controlling layer 124 (SCL2-

2) for a package is formed on the base wafer 10. The adhering member 420 may be formed of an NCF or an ACF. According to an exemplary embodiment, the adhering member 420 may be an NCF. The adhering member 420 may be formed by forming the first stress controlling layer 160 (SCL2-1) for a package and the top pad 170 and adhering an NCF on the base wafer 10.

The NCF is an adhesive insulation film. The second chip 200 is stacked onto the first chip 100 by pressing the second chip 200 onto the first chip 100. The second chip 200 and the first chip 100 are attached to each other by using the adhering member 420 including the NCF. The ACF is an anisotropic conductive film having a structure that conductive particles are dispersed in an adhesive insulation film. The ACF may have anisotropic electric properties for allowing flow of an electric current only toward electrodes, that is, in vertical directions and preventing current flow in horizontal directions. When the adhesive is melt as heat and pressure are applied to the ACF, conductive particles are arranged between electrodes facing each other and exhibit conductivity, whereas the adhesive fills spaces between electrodes adjacent to each other in horizontal directions and insulates the electrodes from one another.

Referring to FIG. 23, the stacked chip 1100 is formed by stacking the second chip 200 on the adhering member 420 on the base wafer 10 including the first chip 100. The second chip 200 is attached to the first chip 100 by press-adhering the internal connection member 240 onto the top pad 170 of the first chip 100. The internal connection member 240 is connected to the top pad 170 of the first chip 100.

When the second chip 200 is stacked onto the first chip 100, the connecting portion between the first chip 100 and the second chip 200 of the stacked chip 1100 is not filled with the underfill 310 as in the previous embodiment, but is filled with the adhering member 420. In this case, an underfill operation may be omitted, and thus the overall fabrication process may be simplified. Next, a semiconductor package may be completed by performing a molding operation, a testing operation, and a sawing operation as described above.

Figure 24:
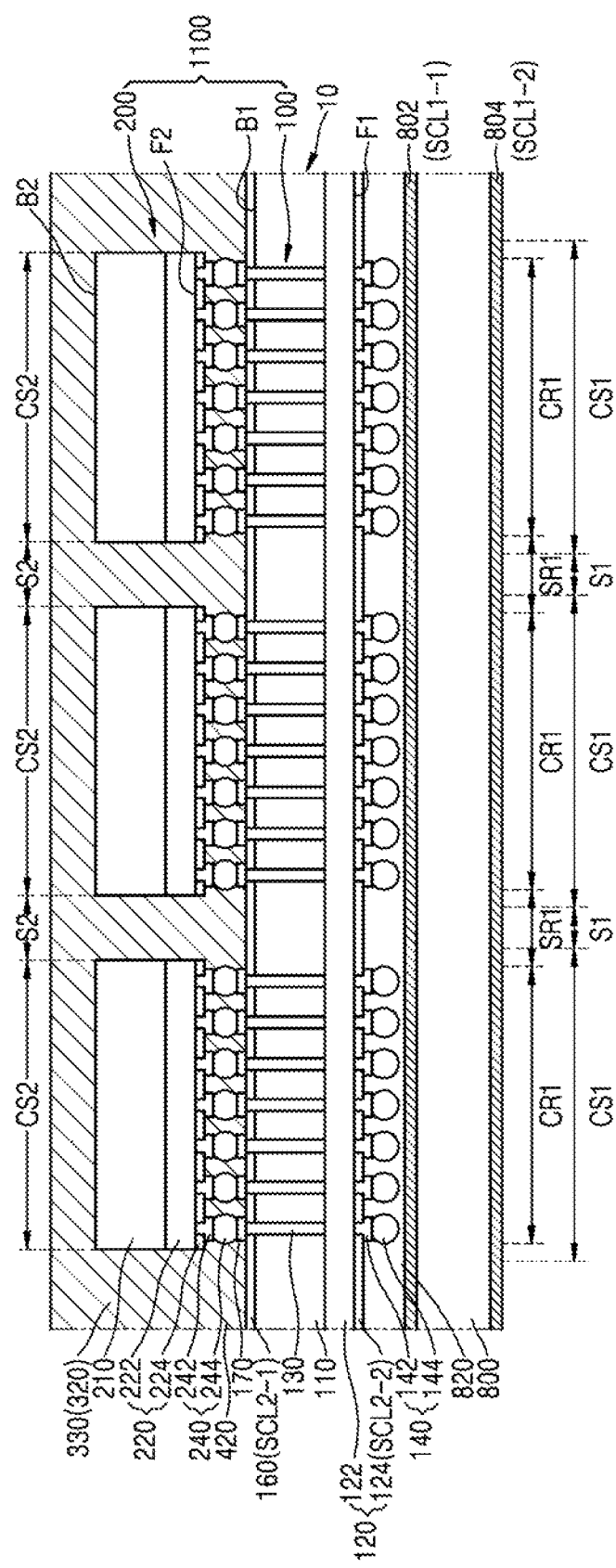
FIGS. 24 to 26 are sectional view diagrams for describing a method of fabricating a semiconductor package according to an exemplary embodiment.
Figure 25:
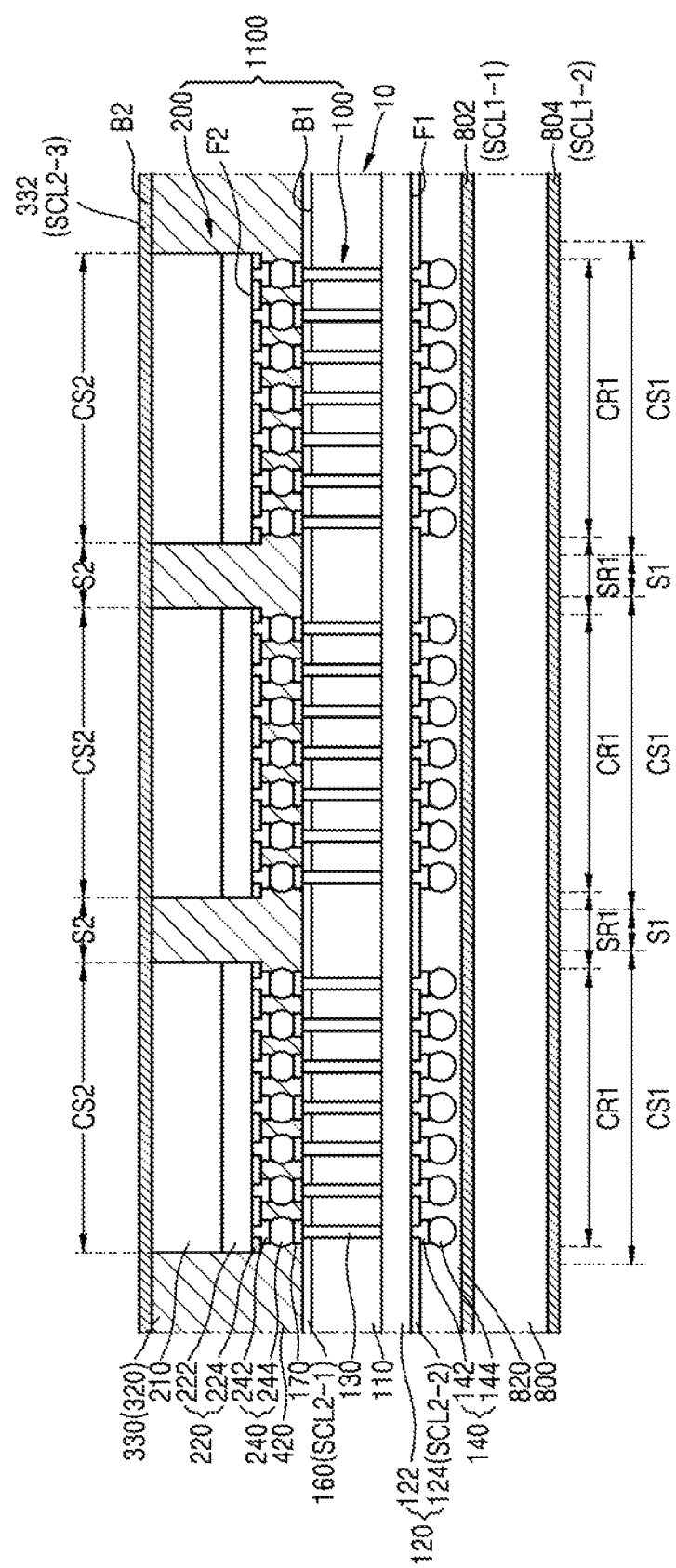
Figure 26:
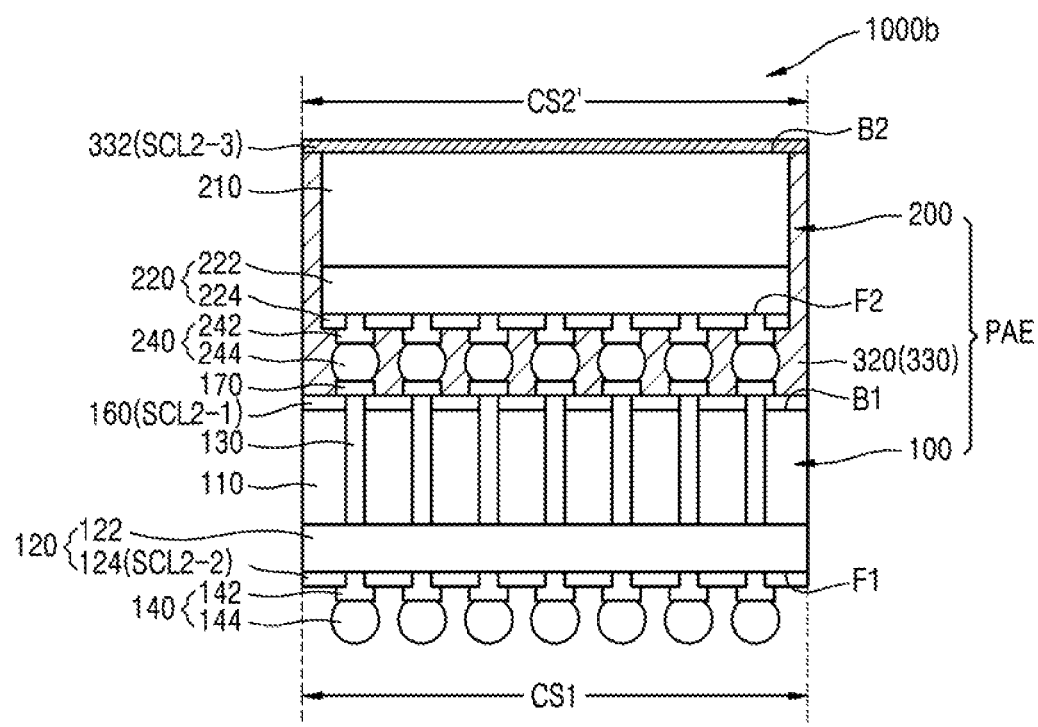

FIGS. 24 to 26 are sectional view diagrams for describing a method of fabricating a semiconductor package according to an exemplary embodiment.

In detail, the exemplary embodiment shown in FIGS. 24 to 26 is identical to the previous exemplary embodiments except that the underfill 310 of the previous embodiments is not formed and the encapsulation layer 330 is formed by using the molding member 320.

First, the fabricating process shown in FIGS. 5 to 7 is performed. As a result, the stacked chip 1100 is formed by stacking the second chip 200 onto the adhering member 420. The adhering member 420 is formed on the base wafer 10 including the first chip 100.

Referring to FIG. 24, the molding member 320 fills the connecting portion between the first chip 100 and the second chip 200 of the stacked chip 1100 and encapsulates two lateral surfaces and the top surface of the second chip 200. The molding member 320 may be referred to as the encapsulation layer 330. The molding member 320 fills the connecting portion between the first chip 100 and the second chip 200, that is, the connecting portion between the top pad 170 of the first chip 100 and the internal connection member 240.

As described above, the molding member 320 may be formed of a polymer, such as a resin. For example, the molding member 320 may be formed of epoxy molding compound (EMC). The encapsulation layer 330 encapsulates lateral surfaces and the top surfaces of the first chip 100 and the second chip 200 of each of the stacked chip 1100.

Referring to FIG. 25, the top surface of the second chip 200 of each of the stacked chips 1100 may be exposed by grinding the top surface of the encapsulation layer 330. As a result, the stacked chips 1100 are encapsulated by the molding member 320 (or the encapsulation layer 330). The encapsulation layer 330 encapsulates lateral surfaces of the first chip 100 and the second chip 200 of each of the stacked chip 1100.

Next, the third stress controlling layer 332 (SCL2-3) for a package is formed on a surface of the second chip 200 and a surface of the encapsulation layer 330. The third stress controlling layer 332 (SCL2-3) for a package may be formed to adjust (or control) warpage of the stacked chips 1100 or the base wafer 10 after the formation of the encapsulation layer 330.

Referring to FIG. 26, as described above, a semiconductor package 1000*b* is completed by performing a testing operation and a sawing operation. The semiconductor package 1000*b* of FIG. 26 may be identical to the semiconductor package 1000 of FIG. 15 except that the encapsulation layer 330 is formed of the molding member 320.

As described above, the semiconductor package 1000*b* includes the package element PAE, which includes the first chip 100, the second chip 200, and the encapsulation layer 330 that encapsulates the first chip 100 and the second chip 200. The stress controlling layer 332 (SCL2-3) for a package is formed on a surface B2 of the package element PAE.

The package element PAE may have a first warpage during the above-stated fabrication process, but the stress controlling layer 332 (SCL2-3) for a package is formed on the surface B2 of the package element PAE to have a second warpage for offsetting the first warpage.

Figure 27:
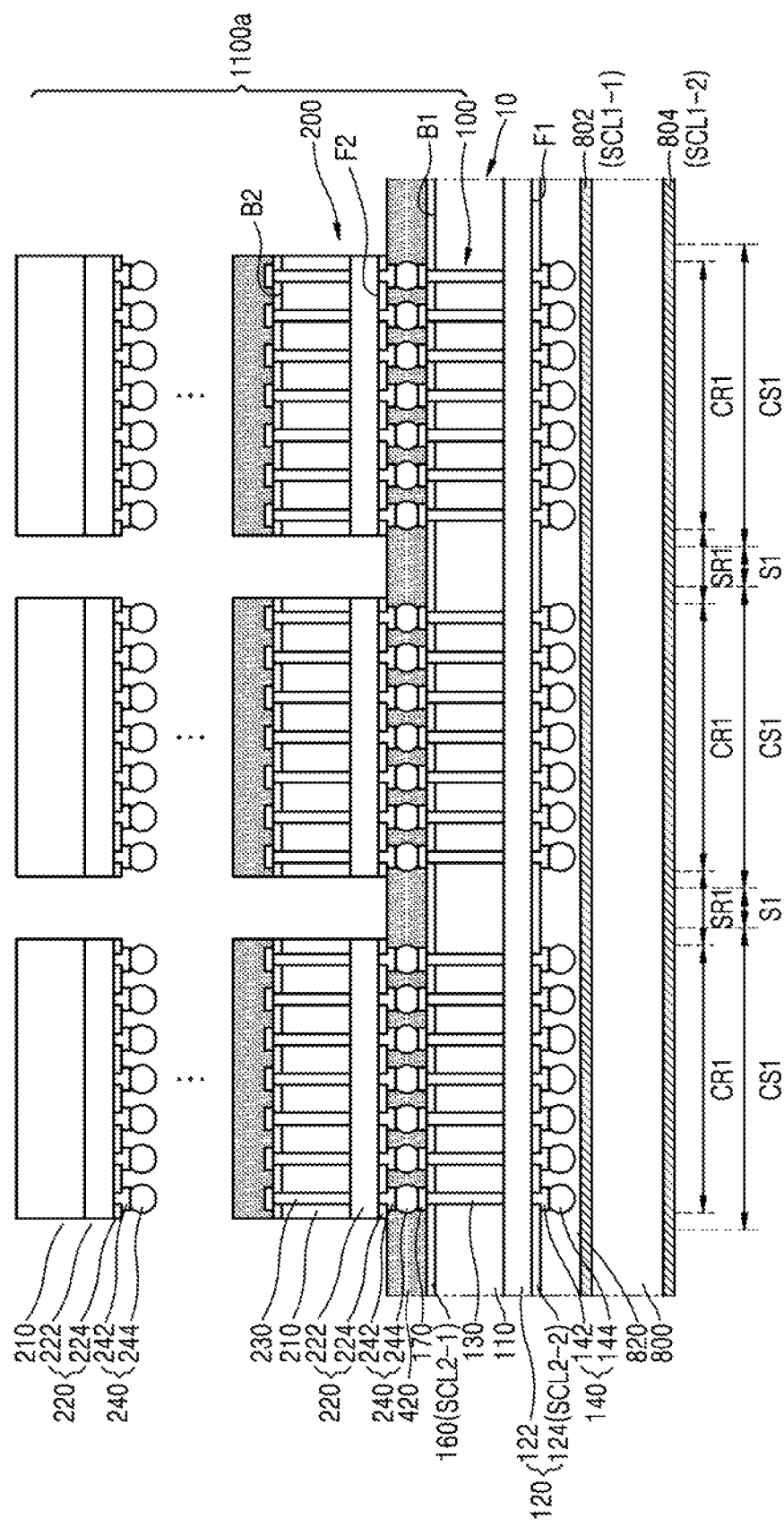
FIG. 27 is a sectional view diagram for describing a method of fabricating a semiconductor package according to an exemplary embodiment.

FIG. 27 is a sectional view diagram for describing a method of fabricating a semiconductor package according to an exemplary embodiment.

In detail, the exemplary embodiment shown in FIG. 27 is identical to the previous embodiments except that a stacked chip 1100*a* is formed by stacking a plurality of second chips 200 on the top surfaces of first chips 100 of a base wafer 10.

The stacked chips 1100*a* are formed by stacking n (n is a positive integer equal to or greater than 2) second chips 200, that is, at least one two second chips 200 on the top surfaces of the first chips 100 of the base wafer 10. The plurality of second chips 200 may also be stacked on each of the first chips 100 of the base wafer 10.

A stacked portion, that is, connecting portion between the first chip 100 and the second chip 200 is filled with an adhering member 420, such as a NCF. The adhering member 420 need not be formed on the top surface of the uppermost chips which are chips stacked at the highest level of the stacked chip 1100*a*. The uppermost chips need not include TSV.

As described above, a stacked portion between the first chip 100 and the second chip 200 is filled with an encapsulation layer 330, such as a underfill 310 or a molding member 320. The lowermost chips (or the first chips 100) in the stacked chip 1100*a* may be electrically connected to the uppermost chips through intervening chips disposed between the lowermost chips and the uppermost chips.

FIGS. 28 to 33 are sectional view diagrams for describing a semiconductor package according to an exemplary embodiment of the present inventive concept and a method of fabricating the same In detail, FIGS. 28 to 33 show an exemplary wafer-level fan-out packages in which a redistribution wiring layer extends into and out of a chip and an external connection member (or an external connecting terminal) is formed at the extending portions.

Figure 28:
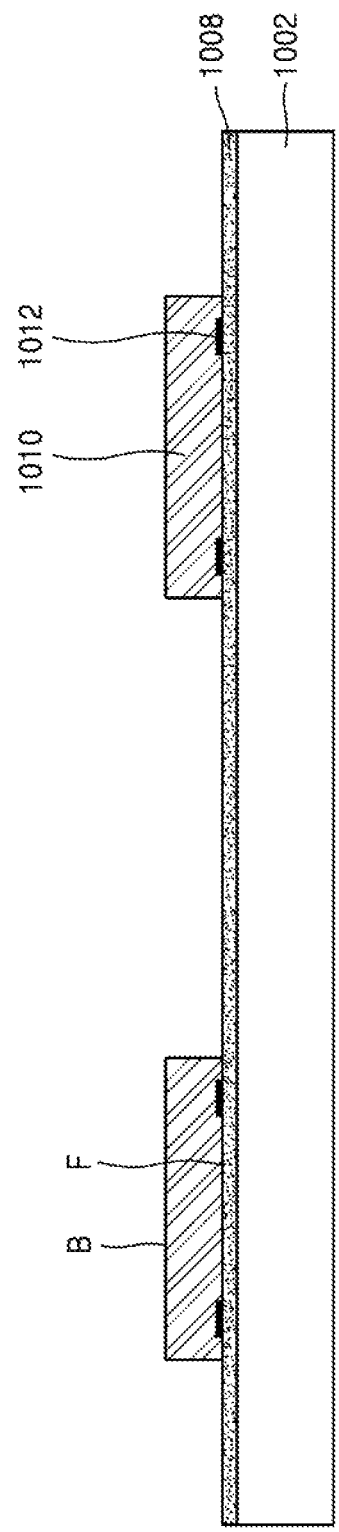
FIGS. 28 to 33 are sectional view diagrams for describing a semiconductor package according to an embodiment of the inventive concept and a method of fabricating the same.

Referring to FIG. 28, separated chips 1010 are attached onto an adhering member 1008 of a supporting carrier 1002 at a constant interval. When the chips 1010 are attached, a bonding pad 1012 for inputting/outputting electric signals is attached onto the adhering member 1008 of the supporting carrier 1002. Therefore, two lateral surfaces and a rear surface B of the chip 1010 may be exposed to the outside.

The supporting carrier 1002 may be formed of silicon, germanium, silicon-germanium, gallium-arsenic (GaAs), a glass, a metal, a plastic, or a ceramic. The adhering member 1008 may be formed of a non-conductive film (NCF), an anisotropic conductive film (ACF), an UV film, an instant glue, a heat hardening adhesive, a laser hardening adhesive, an ultrasound hardening adhesive, a non-conductive paste (NCP), etc.

Figure 29:
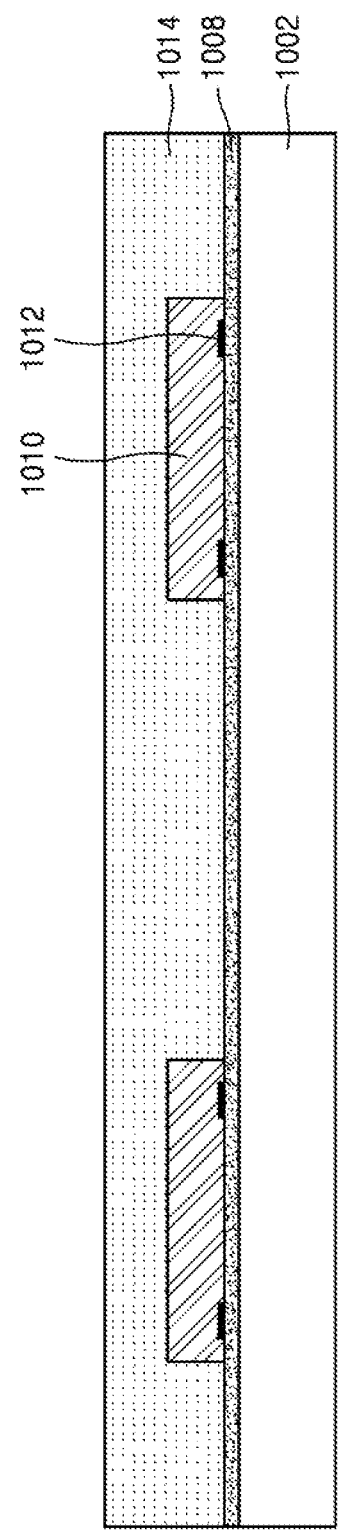

Referring to FIG. 29, an encapsulation layer 1014 is formed by molding or covering the chips 1010 attached to the supporting carrier 1002. The encapsulation layer 1014 may be formed of a molding member. The molding member may be formed of a polymer, e.g., a resin. For example, the molding member may be formed of epoxy molding compound (EMC).

The encapsulation layer 1014 is formed to encapsulate the rear surface B and two lateral surfaces of each of the chips 1010, and the encapsulation layer 1014 may be formed to predetermined thicknesses. The thickness of the encapsulation layer 1014 may be two times or greater than the thickness of the chip 1010.

Figure 30:
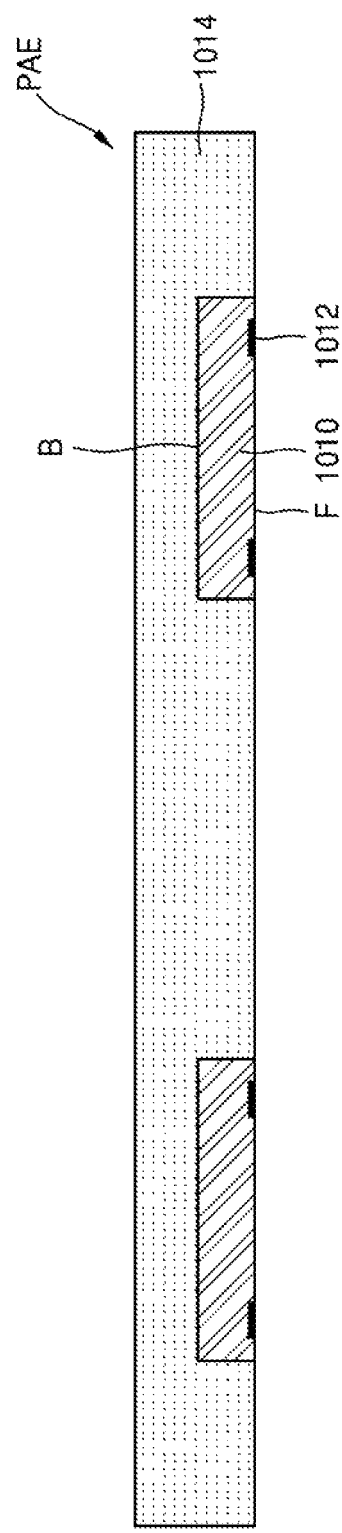

Referring to FIG. 30, the supporting carrier 1002 is separated from the chips 1010 and the encapsulation layer 1014. As a result, the front surface F of each of the chips 1010 and the bottom surface of the encapsulation layer 1014 are exposed to the outside. If necessary, a grinding operation may be performed to make the bottom surface of the encapsulation layer 1014 flat, and a cleaning operation may be performed with respect to the front surface F of the chip 1010. As a result, the package element PAE including the encapsulation layer 1014 that encapsulates the chips 1010 may be obtained. The package element PAE may be warped by the encapsulation layer 1014. For example, the package element PAE may have a first warpage.

Figure 31:
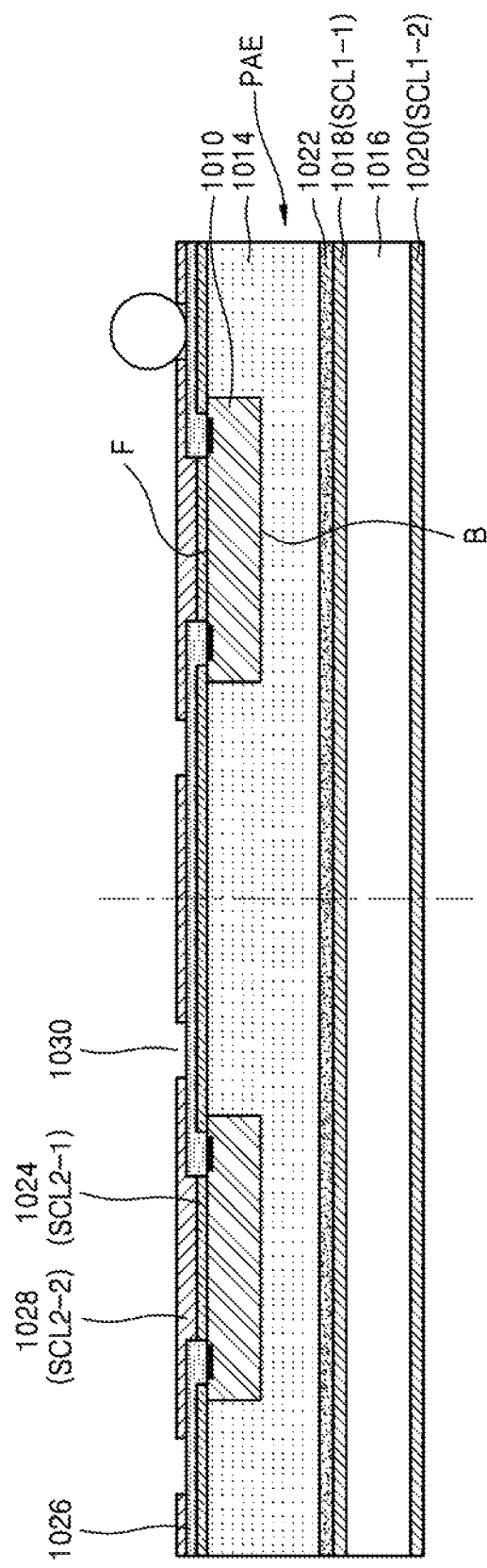

Referring to FIG. 31, a supporting carrier 1016 is prepared. The supporting carrier 1016 may be formed of the same material as the supporting carrier 1002 of FIG. 29. A first stress controlling layer 1018 (SCL1-1) for a carrier and a second stress controlling layer 1020 (SCL1-2) for a carrier are formed on the front surface and the rear surface of the supporting carrier 1016, respectively.

The first stress controlling layer 1018 (SCL1-1) for a carrier and the second stress controlling layer 1020 (SCL1-2) for a carrier may be formed of an oxide layer, a nitride layer, a polymer layer, or a combination thereof. The first stress controlling layer 1018 (SCL1-1) for a carrier and the second stress controlling layer 1020 (SCL1-2) for a carrier may be formed via a chemical vapour deposition (CVD) process, a spin coating process, or a physical vapour deposition (PVD) process.

The first stress controlling layer 1018 (SCL1-1) for a carrier and the second stress controlling layer 1020 (SCL1-2) for a carrier may be formed as layers of different types. The first stress controlling layer 1018 (SCL1-1) for a carrier and the second stress controlling layer 1020 (SCL1-2) for a carrier may be formed to have a thickness from about 1 nm to about 1 mm. Internal stress of each of the first stress controlling layer 1018 (SCL1-1) for a carrier and the second stress controlling layer 1020 (SCL1-2) for a carrier may be from about −1 GPa to about 1 GPa. Therefore, the first stress controlling layer 1018 (SCL1-1) for a carrier and the second stress controlling layer 1020 (SCL1-2) for a carrier may compensate a warpage from about −1 mm to about +1 mm.

After the package element PAE of FIG. 30 is turned upside down, the package element PAE is attached to the supporting carrier 1016 through the first stress controlling layer 1018 (SCL1-1) for a carrier of the supporting carrier 1016 and an adhering member 1022. The adhering member 1022 may be formed of the same material as the adhering member 1008 described above. The first stress controlling layer 1018 is attached to the supporting carrier 1016.

When the supporting carrier 1016 and the package element PAE are adhered to each other, warpage of the package element PAE may be controlled by using the first stress controlling layer 1018 (SCL1-1) for a carrier and the second stress controlling layer 1020 (SCL1-2) for a carrier respectively formed on the front surface and the rear surface of the chip 10106. For example, if the package element PAE has a first warpage, the first stress controlling layer 1018 (SCL1-1) for a carrier and the second stress controlling layer 1020 (SCL1-2) for a carrier may have a second warpage for partially or completely offsetting the first warpage.

A first stress controlling layer 1024 (SCL2-1) for a package that exposes the bonding pad 1012 is formed on a surface of the encapsulation layer 1014 and the front surface F of the chip 1010. Next, a top redistribution wiring layer 1026 is formed to be extended from the bonding pads 1012 of the chips 1010 to a desired location on the encapsulation layer 1014 and/or on the first stress controlling layer 1024 (SCL2-1) for a package.

A second stress controlling layer 1028 (SCL2-2) for a package including external connection holes 1030 outside the chips 1010 is formed on the top redistribution wiring layer 1026. The first stress controlling layer 1024 (SCL2-1) for a package and the second stress controlling layer 1028 (SCL2-2) for a package may be formed of an oxide layer, a nitride layer, a polymer layer, or a combination thereof. Internal stress of the first stress controlling layer 1024 (SCL2-1) for a package and the second stress controlling layer 1028 (SCL2-2) for a package may be from about −1 GPa to about 1 GPa. Therefore, the first stress controlling layer 1024 (SCL2-1) for a package and the second stress controlling layer 1028 (SCL2-2) for a package may compensate a warpage from about −1 mm to about +1 mm.

For example, the first stress controlling layer 1024 (SCL2-1) for a package and the second stress controlling layer 1028 (SCL2-2) for a package may control curve of the package element PAE. For example, if the package element PAE has a first warpage, the first stress controlling layer 1024 (SCL2-1) for a package and the second stress controlling layer 1028 (SCL2-2) for a package may have a second warpage for partially or completely offsetting the first warpage. The first stress controlling layer 1024 (SCL2-1) for a package and the second stress controlling layer 1028 (SCL2-2) for a package may be referred to as passivation layers for protecting the chips 1010.

Figure 32:
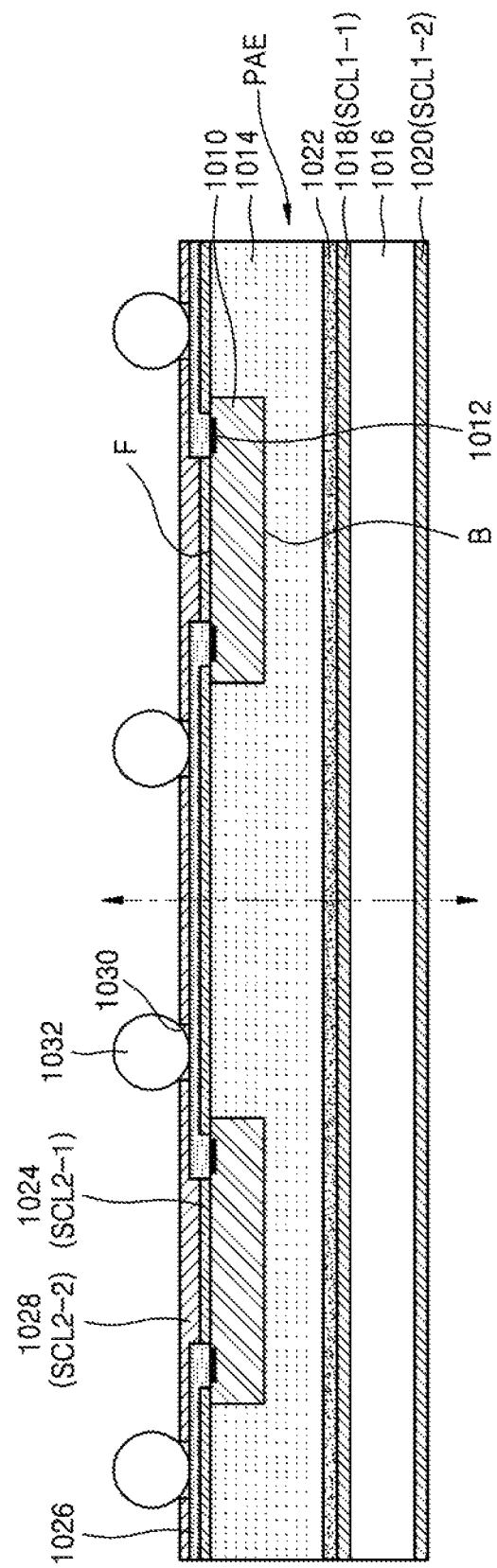

Referring to FIG. 32, external connection members 1032, e.g., solder balls, are formed on the external connection holes 1030. The external connection members 1032 are arranged outside the chips 1010. In an exemplary embodiment, the external connection members 1032 are formed on the chips 1010. If the external connection members 1032 are formed outside the chips 1010, electric short-circuit that occurs as the external connection members 1032 contact each other may be prevented.

Figure 33:
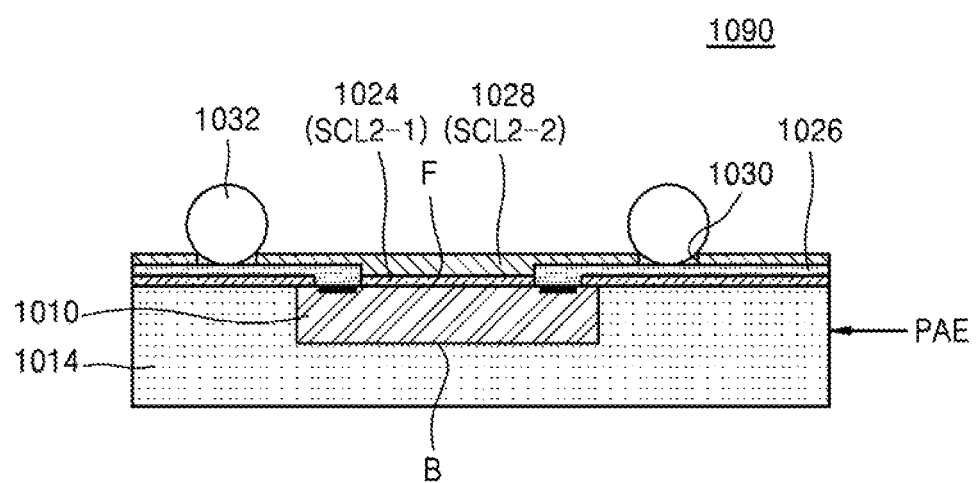

Next, the package element PAE is sawed to the individual chips 1010, and thus a semiconductor package 1090 as shown in FIG. 33 may be completed. Here, configuration of the semiconductor package 1090 of FIG. 33 will be briefly described.

As described above, the semiconductor package 1090 includes a package element PAE, which includes a chip 1010 and an encapsulation layer 1014 that encapsulates the rear surface B and lateral surfaces of the chip 1010 and exposes the front surface F of the chip 1010. External connection members 1032 are formed on the package element PAE. The external connection members 1023 are closer to the front surface F of the chip 1010. The external connection members 1032 are formed without overlapping the chip 1010 in FIG. 33. The present inventive concept is not limited thereto. For example, the external connection members 1032 are formed on the chip 1010.

The first stress controlling layer 1024 (SCL2-1) for a package and the second stress controlling layer 1028 (SCL2-2) for a package are formed on a surface of the package element PAE. The first stress controlling layer 1024 (SCL2-1) for a package and the second stress controlling layer 1028 (SCL2-2) for a package are formed on the front surface F of the chip 1010 and a surface of the encapsulation layer 1014. The first stress controlling layer 1024 (SCL2-1) for a package and the second stress controlling layer 1028 (SCL2-2) for a package may control warpage of the package element PAE that may occur due to the encapsulation layer 1014.

For example, although the package element PAE may have a first warpage during the above-stated fabrication process, the first stress controlling layer 1024 (SCL2-1) for a package and the second stress controlling layer 1028 (SCL2-2) for a package may be formed on a surface of the package element PAE to have a second warpage for partially or completely offsetting the first warpage.

Figure 34:
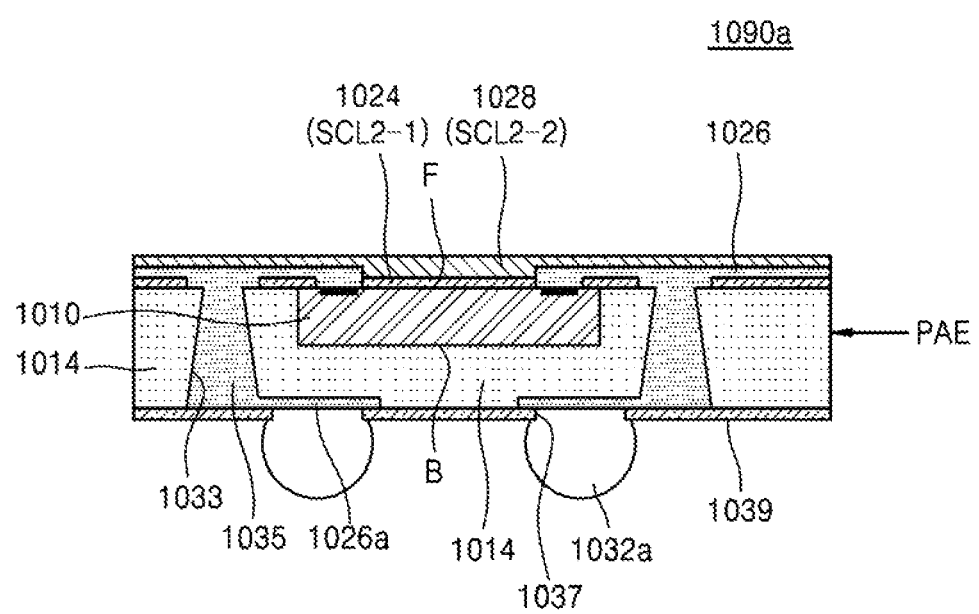
FIG. 34 is a sectional view diagram for describing a semiconductor package according to an exemplary embodiment and a method of fabricating the same.

FIG. 34 is a sectional view diagram for describing a semiconductor package according to an exemplary embodiment and a method of fabricating the same.

In detail, a semiconductor package 1090a of FIG. 34 may be substantially identical to the semiconductor package 1090 of FIG. 33 except that external connection members 1032a are formed in the rear surface of the chip 1010. In FIG. 34, components identical to those of FIG. 33 will be briefly described or descriptions thereof will be omitted.

In the semiconductor package 1090a, encapsulation penetrating via holes 1033 are formed in the encapsulation layer 1014. The encapsulation penetrating via hole 1033 may be a via hole vertically penetrating through the encapsulation layer 1014. Encapsulation penetrating via electrodes 1035 are formed in the encapsulation penetrating via holes 1033. The encapsulation penetrating via electrodes 1035 may be connected to the top redistribution wiring layer 1026 formed on a surface of the package element PAE.

The encapsulation penetrating via electrodes 1035 may be connected to a bottom redistribution wiring layer 1026a rewired on the rear surface of the package element PAE, that is, the rear surface of the encapsulation layer 1014. The bottom redistribution wiring layer 1026a may be a material layer rewired from the encapsulation penetrating via electrodes 1035 to a desired location on the encapsulation layer 1014. A redistribution wiring insulation layer 1039 including external connection holes 1037 is formed on the encapsulation penetrating via electrodes 1035 and the bottom redistribution wiring layer 1026a at the bottom of the package element PAE. The external connection members 1032a are formed on the bottom redistribution wiring layer 1026a and the external connection holes 1037.

As a result, the external connection members 1032a are connected to the encapsulation penetrating via electrodes 1035 formed in the encapsulation layer 1014 and are formed in the rear surface of the chip 1010 via the bottom redistribution wiring layer 1026a formed on the rear surface of the encapsulation layer 1014. The external connection members 1032a are formed to overlap the chip 1010. The present inventive concept is not limited thereto. For example, the external connection members 1032 may be formed without overlapping the chip 1010.

FIGS. 35 to 43 are sectional view diagrams for describing a semiconductor package according to an exemplary embodiment and a method of fabricating the same. FIGS. 35 to 43 show that a semiconductor package is embodied by forming a chip-on-chip (COC) structure by stacking second chips 1150 on base chips 1120 encapsulated by a based encapsulation layer on a supporting carrier 1112. The base chips may be referred to as first chips.

Figure 35:
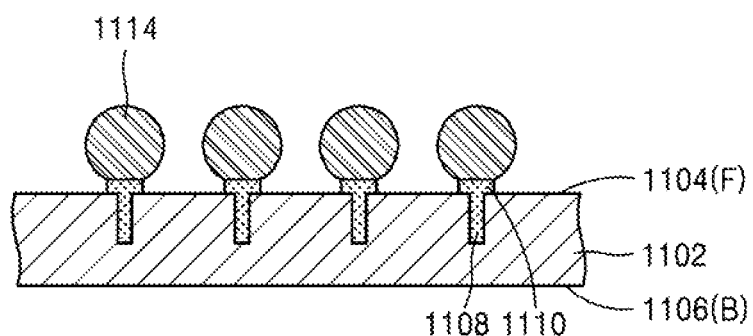
FIGS. 35 to 43 are sectional view diagrams for describing a semiconductor package according to an exemplary embodiment and a method of fabricating the same.

Referring to FIG. 35, a base substrate 1102 includes an active surface 1104 and a non-active surface 1106. An integrated circuit may be formed in a region closer to the active surface 1104 than the non-active surface 1106. The active surface 1104 may be a front surface, whereas the non-active surface 1106 may be a rear surface B. The base substrate 1102 is a wafer-level substrate. The base substrate 1102 is formed of a silicon substrate, that is, a silicon wafer. A plurality of chips are formed at the base substrate 1102. Base penetrating via electrodes 1108 and base pads 1110 connected to the base penetrating via electrodes 1108 are formed in the base substrate 1102.

The base penetrating via electrode 1108 is formed to a predetermined depth without completely penetrating through the base substrate 1102 and penetrates through the base substrate 1102 in a later operation. The base penetrating via electrode 1108 is formed of a metal layer, e.g., an aluminum layer or a copper layer.

The base pad 1110 may be formed with the base penetrating via electrode 1108 simultaneously or separately. Like the base penetrating via electrode 1108, the base pad 1110 may be formed of a metal layer, e.g., an aluminum layer or a copper layer. The base pad 1110 may be a redistribution wiring pad using a redistribution wiring layer (not shown) formed on the base substrate 1102. Next, first external connection members 1114 are formed on the base pad 1110. The first external connection members 1114 may be solder balls.

Figure 36:
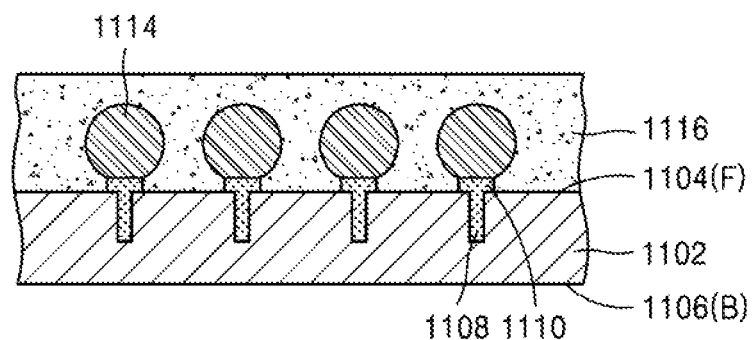

Referring to FIG. 36, a base encapsulation layer 1116 that protects the active surface 1104 of the base substrate 1102, the base pads 1110, and the first external connection members 1114 is formed. The base encapsulation layer 1116 may be formed by using one of various molding methods, e.g., a method of introducing a liquefied resin into a mold and solidifying the resin, a method of laminating a film-type resin and solidifying the resin, a method of spraying a resin and solidifying the resin, etc.

Figure 37:
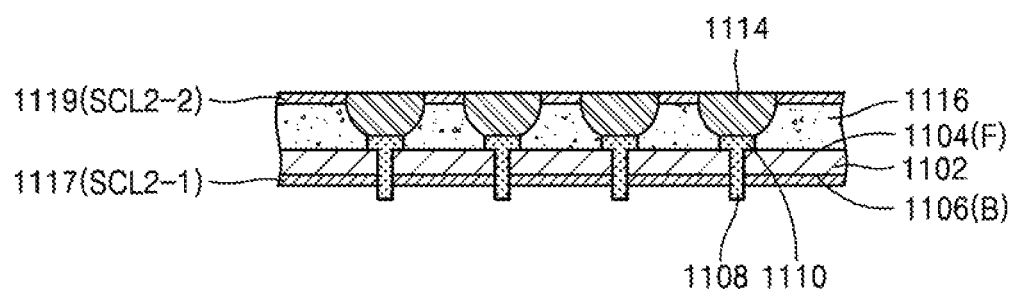

Referring to FIG. 37, the first external connection members 1114 and the base encapsulation layer 1116 are polished to be planarized. The first external connection members 1114 and the base encapsulation layer 1116 are polished and planarized to secure reliability of a later fabrication process for etching the rear surface of the base substrate 1102, that is, the non-active surface 1106 (B) to reduce thickness of the base substrate 1102.

At the wafer level, thickness of the base substrate 1102 is reduced by etching the rear surface of the base substrate 1102, that is, the non-active surface 1106 B. As a result, base penetrating via electrodes 1108 that protrude from the rear surface of the base substrate 1102 are formed. The portions of the base penetrating via electrodes 1108 protruding from the rear surface of the base substrate 1102 may be exposed. In FIGS. 35 to 37, the curved lines at two opposite ends of the structures indicate the wafer-level.

A first stress controlling layer 1117 (SCL2-1) for a package and a second stress controlling layer 1119 (SCL2-2) for a package are formed on the non-active surface 1106 B of the base substrate 1102 and a front surface of the base encapsulation layer 1116. The first stress controlling layer 1117 (SCL2-1) for a package and the second stress controlling layer 1119 (SCL2-2) for a package may be formed of an oxide layer, a nitride layer, a polymer layer, or a combination thereof. The first stress controlling layer 1117 (SCL2-1) for a package and the second stress controlling layer 1119 (SCL2-2) for a package may be formed using a chemical vapour deposition (CVD) process, a spin coating process, or a physical vapour deposition (PVD) process.

The first stress controlling layer 1117 (SCL2-1) for a package and the second stress controlling layer 1119 (SCL2-2) for a package may be formed to have a thickness from about 1 nm to about 1 mm. The internal stress of the first stress controlling layer 1117 (SCL2-1) for a package and the second stress controlling layer 1119 (SCL2-2) for a package may be from about −1 GPa to about 1 GPa. Therefore, the first stress controlling layer 1117 (SCL2-1) for a package and the second stress controlling layer 1119 (SCL2-2) for a package may compensate a warpage from about −1 mm to about +1 mm.

As a result, the first stress controlling layer 1117 (SCL2-1) for a package and the second stress controlling layer 1119 (SCL2-2) for a package may be formed to control warpage of the base substrate 1102 after the formation of the base encapsulation layer 1116.

Figure 38:
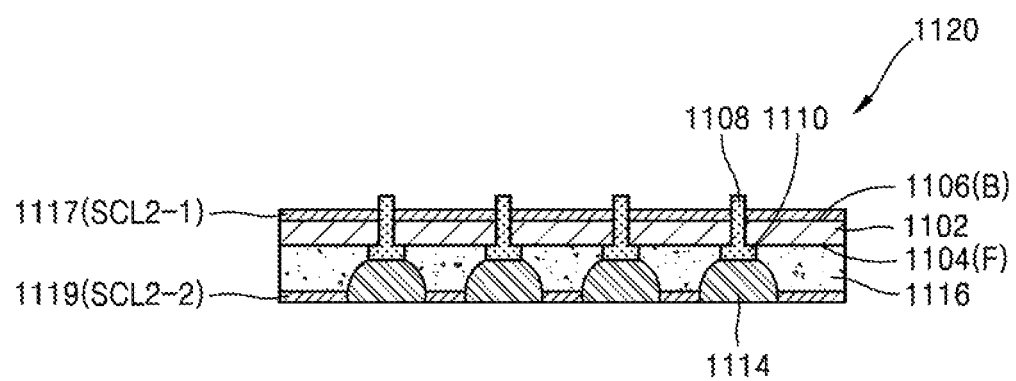

Referring to FIG. 38, the plurality of individual (or unit) base chips 1120 are obtained by sawing the wafer-level base substrate 1102 and the base encapsulation layer 1116 while the outermost surface of the base encapsulation layer 1116 faces downward. In other words, a singulation process for forming the individual base chips 1120 by sawing the wafer-level base substrate 1102 and the base encapsulation layer 1116 is performed. In each of the base chips 1120, the non-active surface 1106 B is downward. For convenience of explanation, FIG. 38 shows only one of the one base chips 1120.

Figure 39:
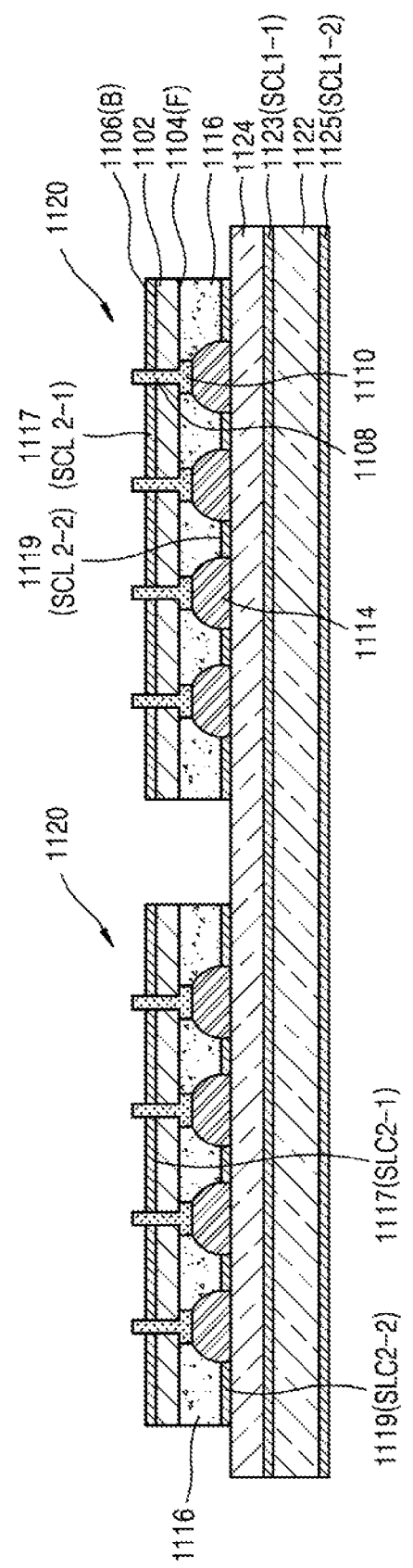

Referring to FIG. 39, second stress controlling layers 1119 (SCL2-2) for a package of the plurality of base chips 1120 are attached to a supporting carrier 1122 using an adhering member 1124. The supporting carrier 1122 may be wafer-sized, and the base chips 1120 may be reconfigured to be easily stacked onto the supporting carrier 1122 in a later operation.

A first stress controlling layer 1123 (SCL1-1) for a carrier and a second stress controlling layer 1125 (SCL1-2) for a carrier are formed on the front surface and the rear surface of the supporting carrier 1122, respectively. The first stress controlling layer 1123 (SCL1-1) for a carrier and the second stress controlling layer 1125 (SCL1-2) for a carrier may be formed of an oxide layer, a nitride layer, a polymer layer, or a combination thereof. The first stress controlling layer 1123 (SCL1-1) for a carrier and the second stress controlling layer 1125 (SCL1-2) for a carrier may be formed as layers of different types.

The internal stress of the first stress controlling layer 1123 (SCL1-1) for a carrier and the second stress controlling layer 1125 (SCL1-2) for a carrier may be from about −1 GPa to about 1 GPa. Therefore, the first stress controlling layer 1123 (SCL1-1) for a carrier and the second stress controlling layer 1125 (SCL1-2) for a carrier may compensate a warpage from about −1 mm to about +1 mm. As a result, the first stress controlling layer 1123 (SCL1-1) for a carrier and the second stress controlling layer 1125 (SCL1-2) for a carrier may control (or adjust) warpage of the base substrate 1102.

Figure 40:
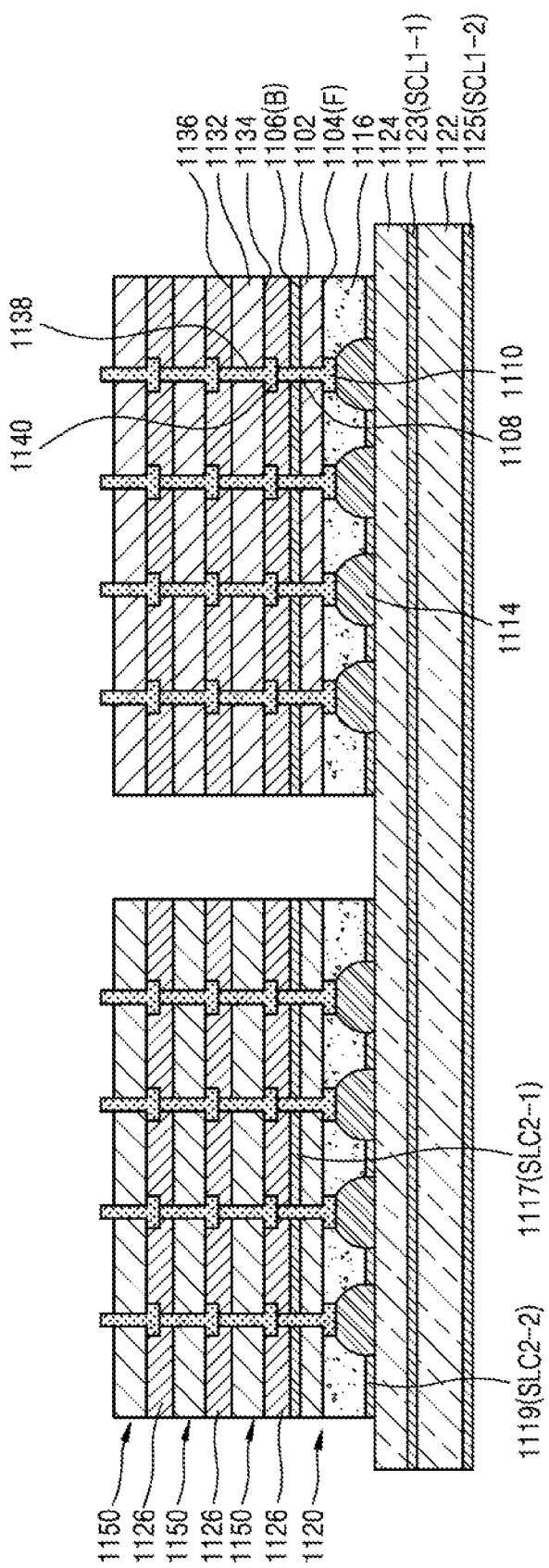

Referring to FIG. 40, a plurality of chips 1150 are stacked and attached onto the base chips 1120 formed on the supporting carrier 1122 at the wafer-level using adhering members 1126. For convenience of explanation, FIG. 40 shows an example in which only the three chips 1150 are stacked. The chips 1150 are attached to each other by using the adhering members 1126, such as a resin. In an exemplary embodiment, the adhering members 1126 may be injected into spaces formed between two adjacent chips 1150. In an exemplary embodiment, the adhering members 1126 are disposed on the base chips 1120 in advance and then, the chips 1150 are attached to the adhering members 1126.

The chip 1150 includes a chip penetrating via electrode 1138 penetrates through a substrate 1132 to be connected to a chip pad 1140. The substrate 1132 of the second chip 1150 has an active surface 1134 and a non-active surface 1136. An integrated circuit of the chip 1150 may be formed in a region closer to the active surface 1134 than the non-active surface 1136. In the second chip 1150, the chip pad 1140 is formed on the active surface 1134 of the substrate 1132, and the chip penetrating via electrode 1138 protrudes beyond the non-active surface 1136.

A chip encapsulated by a based encapsulation layer may be referred to as a first chip 1120, and an uppermost second chip 1150 is connected to the first chip 1120 using intervening chips 1150 disposed the first chip 1120 and the uppermost second chip 1150.

Figure 41:
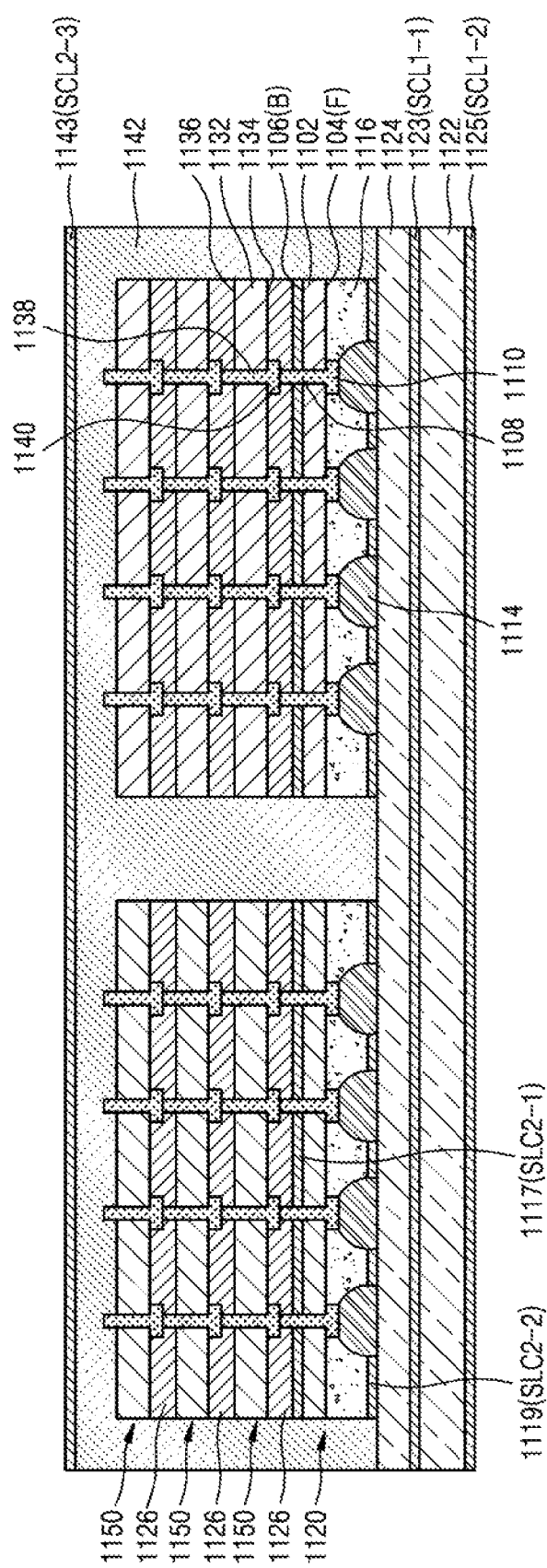

Referring to FIG. 41, an encapsulation layer 1142 is formed to protect the base chips 1120 and the second chips 1150 formed on the supporting carrier 1122. The encapsulation layer 1142 may be formed by using one of various molding methods as described above in relation to the base encapsulation layer 1116.

Next, if necessary, a third stress controlling layer 1143 (SCL2-3) for a package may be formed on the encapsulation layer 1142. The third stress controlling layer 1143 (SCL2-3) for a package may be formed of an oxide layer, a nitride layer, a polymer layer, or a combination thereof. The third stress controlling layer 1143 (SCL2-3) for a package may be formed to have a thickness from about 1 nm to about 1 mm. The third stress controlling layer 1143 (SCL2-3) for a package may control (or adjust) warpage of the chip 1150 or the base substrate 1102.

Figure 42:
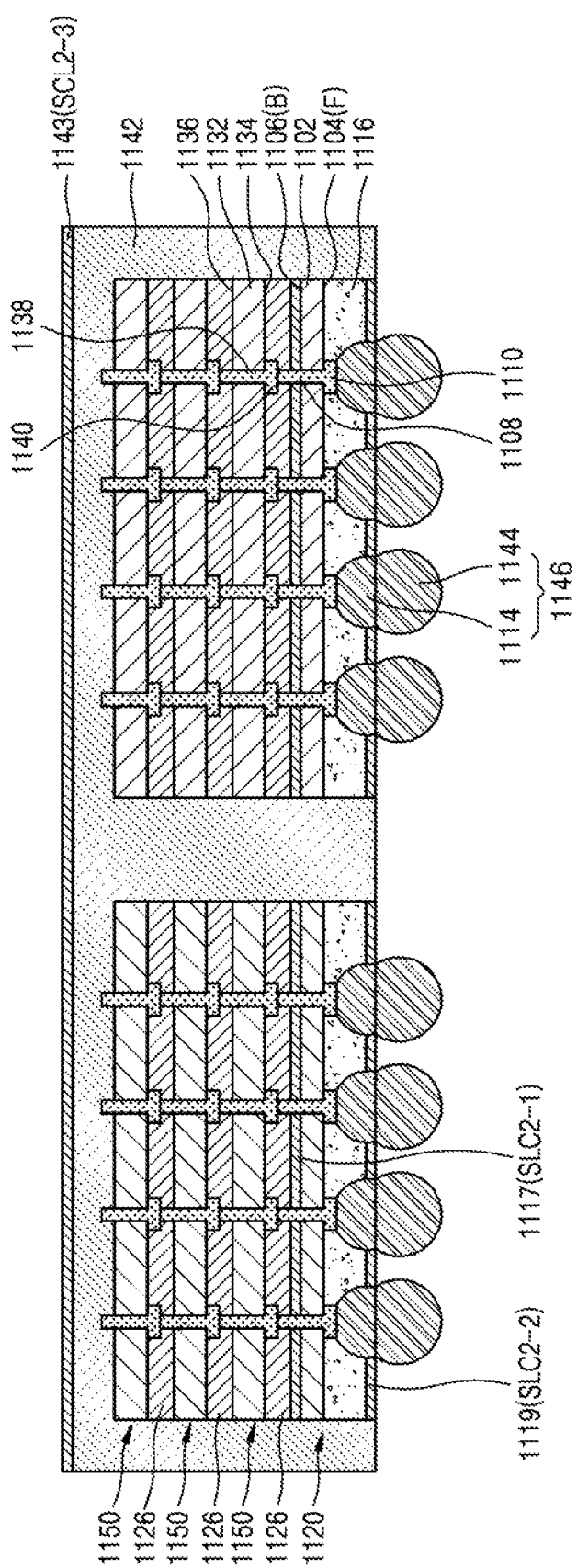
Figure 43:
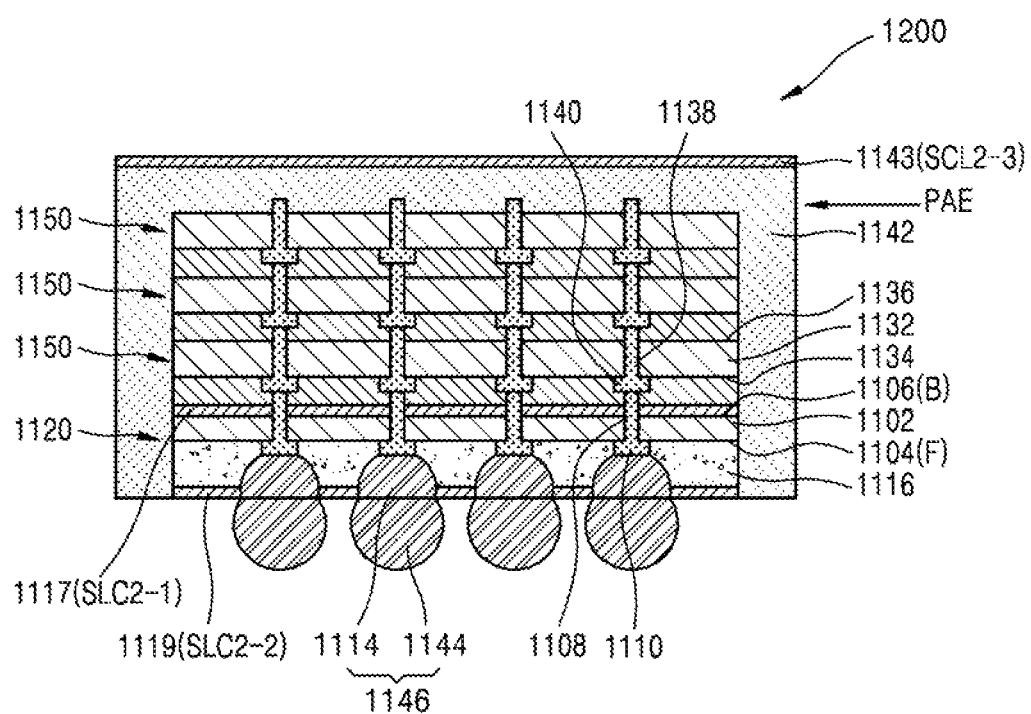

Referring to FIGS. 42 and 43, the supporting carrier 1122 is separated from the base chips 1120 and the stacked chips 1150 of FIG. 41 by removing the adhering member 1124. Next, second external connection members 1144 are formed by forming solder balls on the first external connection members 1114 connected to the base pad 1110 at the wafer-level. As a result, external connection members 1146 consisting of the second external connection members 1144 and the first external connection members 1114 are formed. The second external connection members 1144 are connected to the first external connection members 1114.

Next, as shown in FIG. 43, a semiconductor package 1200 is fabricated by sawing the encapsulation layer 1142 at the wafer-level. The semiconductor package 1200 includes a package element PAE that includes the first chip 1120, the second chip 1150, and the encapsulation layer 1142 that encapsulates the first chip 1120 and the second chip 1150. The first chip 1120 is encapsulated by the base encapsulation layer 1116. The second chip 1150 is connected to the first chip 1120 using the chip penetrating via electrode 1138.

A stress controlling layer 1143 (SCL2-3) for a package is formed on a surface of the package element PAE. The package element PAE may have a first warpage during the above-stated fabrication process, but the stress controlling layer 1143 (SCL2-3) for a package is formed on a surface of the package element PAE to have a second warpage for offsetting the first warpage. For example, the first warpage of the package element PAE has a positive value or a negative value, and the second warpage of the third stress controlling layer 1143 (SCL2-3) for a package may have a negative value or a positive value opposite to the value of the first warpage.

Figure 44:
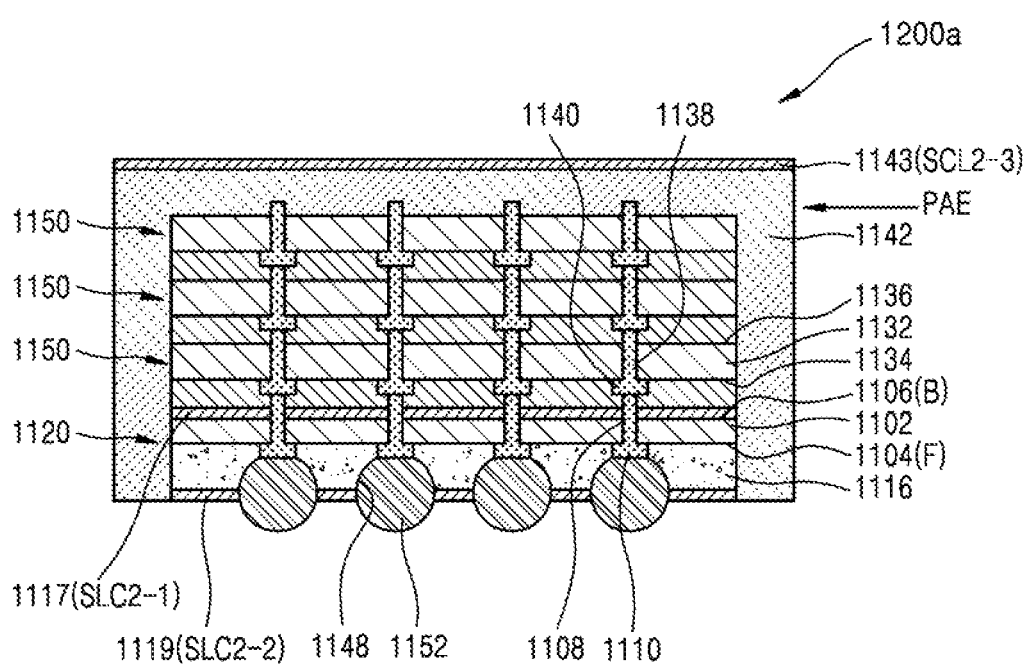
FIG. 44 is a sectional view diagram for describing a semiconductor package according to an exemplary embodiment and a method of fabricating the same.

FIG. 44 is a sectional view diagram for describing a semiconductor package according to an exemplary embodiment and a method of fabricating the same.

In detail, a semiconductor package 1200a of FIG. 44 may be identical to the semiconductor package 1200 of FIG. 43 except the structure of external connection members 1152. Descriptions of components of FIG. 44 identical to those shown in FIG. 43 will be briefly given or omitted for convenience of explanation In the semiconductor package 1200a, a hole 1148 exposing the base pad 1110 is formed in the base encapsulation layer 1116. The external connection member 1152 fills the hole 1148, and is connected to the base pad 1110. The external connection member 1152 protrudes beyond the base encapsulation layer 1116. Therefore, compared to the semiconductor package 1200 of FIG. 43, the external connection member 1152 are formed by using a single solder ball.

Figure 45:
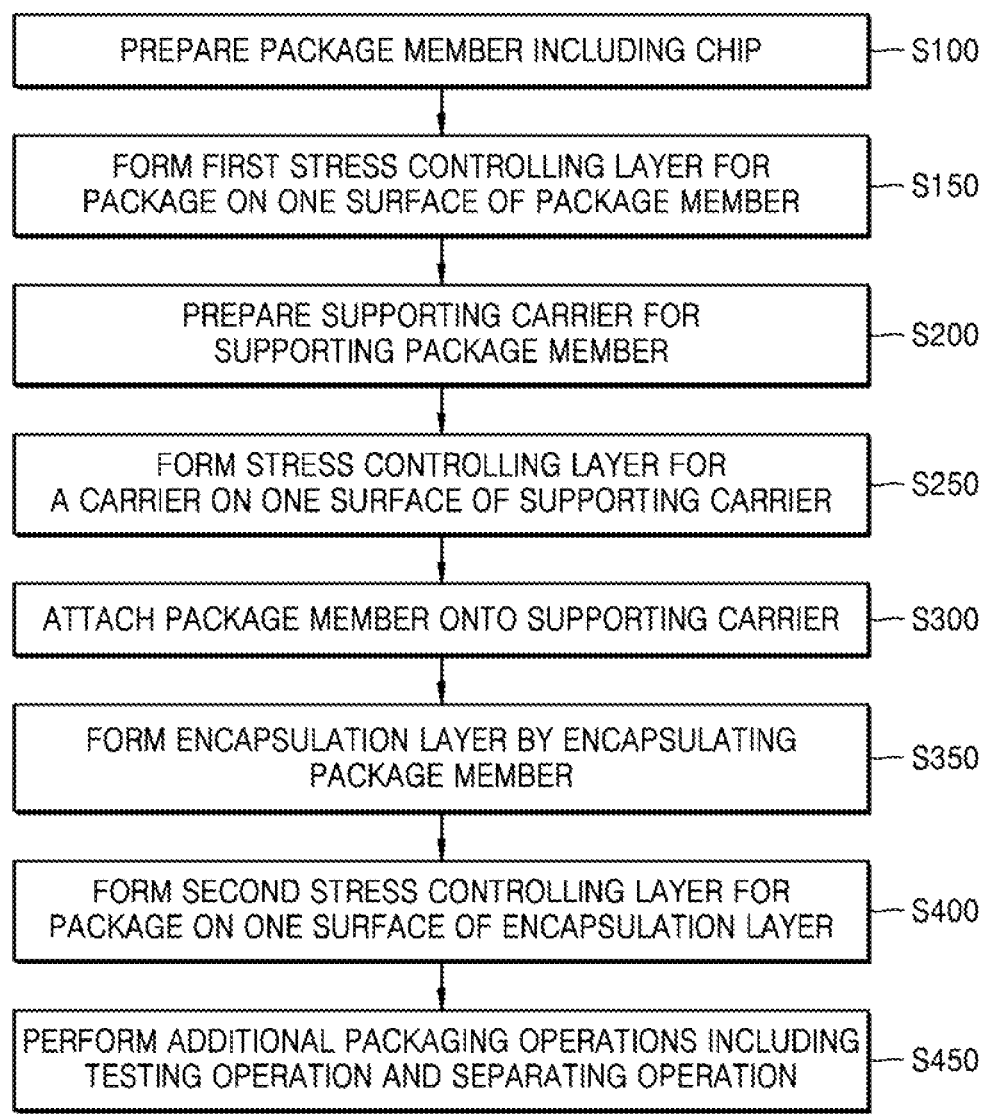
FIG. 45 is a flowchart for describing a method of fabricating a semiconductor package according to an exemplary embodiment.

FIG. 45 is a flowchart for describing a method of fabricating a semiconductor package according to an exemplary embodiment.

In detail, a method of fabricating a semiconductor package includes an operation for preparing a package member including a chip (operation S100). As described above, the package member may include a chip embodied on a semiconductor wafer (or a semiconductor substrate). As described above, the package member may include a plurality of chips. As described above, the package member may be a stacked chip in which a second chip is stacked on a first chip via an internal connection member or a chip penetrating via electrode.

If necessary, a first stress controlling layer for a package is selectively formed on a surface of the package member (operation S150). The first stress controlling layer for a package may exhibit a tensile stress or a compressive stress. The first stress controlling layer for a package may be formed of an oxide layer, a nitride layer, a polymer layer, or a combination thereof.

A supporting carrier for supporting the package member is prepared (operation S200). If necessary, a stress controlling layer for a carrier is selectively formed on a surface of the supporting carrier (operation S250). The stress controlling layer for a carrier may exhibit a tensile stress or a compressive stress. As described above, the stress controlling layer for a carrier may be formed on at least one of the front surface and the rear surface of the supporting carrier.

The stress controlling layer for a carrier may be formed of an oxide layer, a nitride layer, a polymer layer, or a combination thereof. A first stress controlling layer for a carrier and a second stress controlling layer for a carrier of different types may be formed on the front surface and the rear surface of the supporting carrier, respectively.

The package member is attached onto the supporting carrier (operation S300). An encapsulation layer for encapsulating the package member is formed (operation S350). If the package member is a stacked chip in which a second chip is stacked on a first chip, the encapsulation layer may be formed to surround the connecting portion between the first chip and the second chip or top surfaces and lateral surfaces of the first chip and the second chip.

If necessary, a second stress controlling layer for a package is selectively formed on a surface of the encapsulation layer. The second stress controlling layer for a package may be a tensile stress or a compressive stress. The second stress controlling layer for a package may be formed of an oxide layer, a nitride layer, a polymer layer, or a combination thereof.

Next, a semiconductor package may be completed by performing additional operations, such as a testing operation and a singulation operation with respect to the package member having formed thereon the encapsulation layer (operation S450).

While the above-stated semiconductor package fabrication process is being performed, the package member may have a first warpage during fabrication of a chip or the formation of the encapsulation layer. A first stress controlling layer for a package, a second stress controlling layer for a package, or a stress controlling layer for a carrier formed on at least one surface of the supporting carrier and the package member may have a second warpage for offsetting the first warpage.

The second warpage embodied at the first stress controlling layer for a package, the second stress controlling layer for a package, or the stress controlling layer for a carrier may be adjusted according to the internal stress and thickness of stress controlling layers. Therefore, curve of a finally fabricated semiconductor package may be suppressed.

Figure 46:
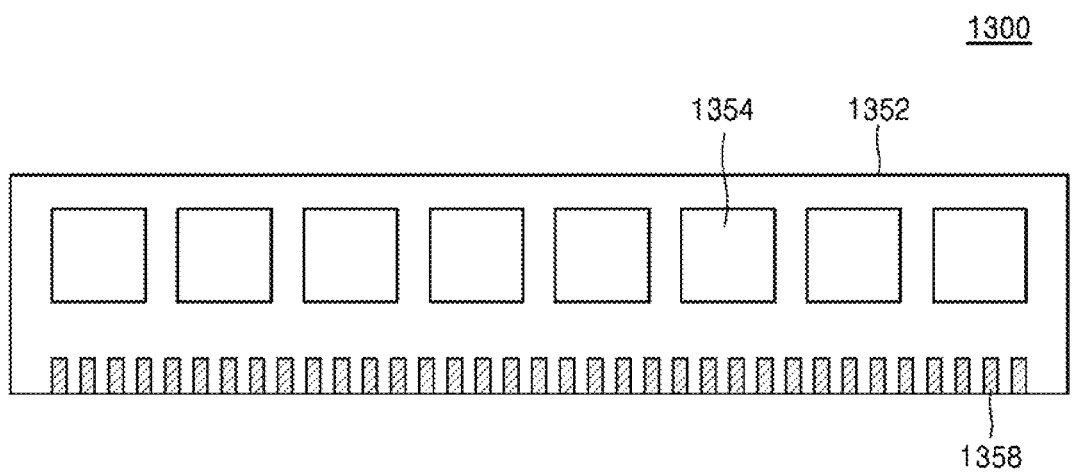
FIG. 46 is a schematic plan view of a semiconductor module including a semiconductor package according to an exemplary embodiment.

FIG. 46 is a schematic plan view of a semiconductor module including a semiconductor package according to an exemplary embodiment.

In detail, a semiconductor module 1300 includes a module substrate 1352, a plurality of semiconductor packages 1354 arranged on the module substrate 1352, and module contacting terminals 1358 that are formed along an edge of the module substrate 1352 and electrically connected to the respective semiconductor packages 1354.

The module substrate 1352 may be a printed circuit board (PCB). Both surfaces of the module substrate 1352 may be used. In other words, the semiconductor packages 1354 may be arranged on both the front surface and the rear surface of the module substrate 1352. Although FIG. 46 shows that the eight semiconductor packages 1354 are arranged on the front surface of the module substrate 1352, it is merely an example. The semiconductor module 1300 may further include a separate semiconductor package for controlling the semiconductor packages 1354.

At least one of the semiconductor packages 1354 may be a semiconductor package according to the above-stated embodiments. The module contacting terminals 1358 may be formed of a metal and may be oxidization-resistant. The module contacting terminals 1358 may be configured according to standard specifications of the semiconductor module 1300. Therefore, the number of the module contacting terminals 1358 shown in FIG. 46 is merely exemplary and is not limiting.

Figure 47:
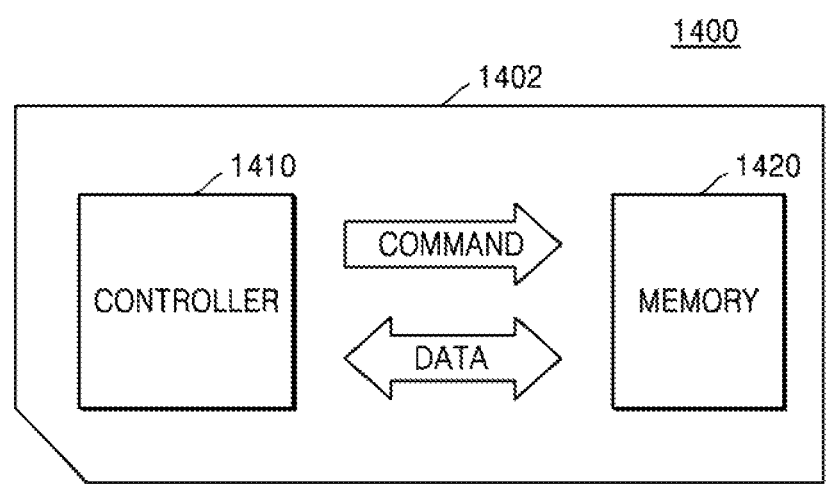
FIG. 47 is a schematic diagram showing a card including a semiconductor package according to an exemplary embodiment.

FIG. 47 is a schematic diagram showing a card including a semiconductor package according to an exemplary embodiment.

In detail, a card 1400 may include a controller 1410 and a memory 1420 arranged on a circuit board 1402. The controller 1410 and the memory 1420 may be arranged to exchange electric signals. For example, when the controller 1410 issues a command, the memory 1420 may transmit data. The memory 1420 or the controller 1410 may include a semiconductor package according to an exemplary embodiment. The card 1400 may be one of various types of cards, e.g., a memory stick card, a smart media card (SM), a secure digital card (SD), a mini secure digital card (mini SD), or a multimedia card (MMC).

Figure 48:
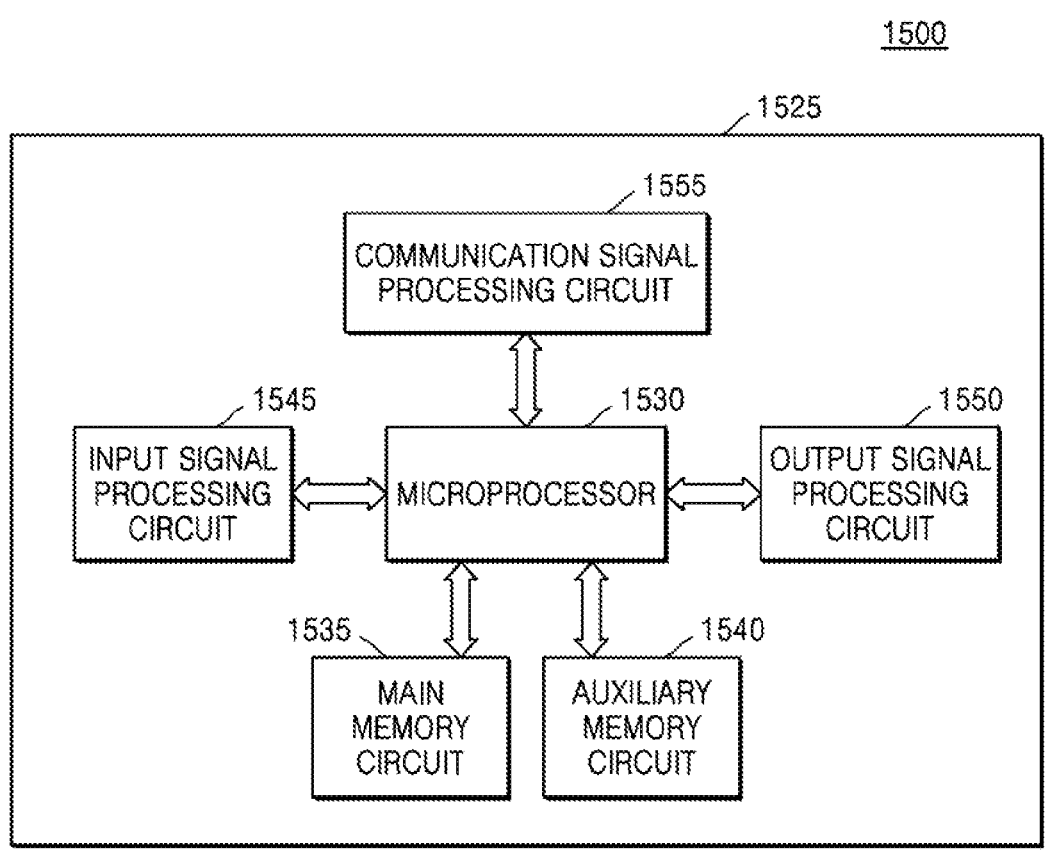
FIG. 48 is a schematic block diagram showing an electronic circuit board including a semiconductor package according to an exemplary embodiment.

FIG. 48 is a schematic block diagram showing an electronic circuit board including a semiconductor package according to an exemplary embodiment.

In detail, an electronic circuit board 1500 includes a microprocessor 1530, a main memory circuit 1535 and a supplementary memory circuit 1540 that communicate with the microprocessor 1530, an input signal processing circuit 1545 that sends a command to the microprocessor 1530, a output signal processing circuit 1550 that receives a command from the microprocessor 1530, and a communication circuit 1555 that exchanges electric signals with other circuit boards, where the above-states components are formed on a circuit board 1525. The arrows may be understood as paths via which electric signals may be transmitted.

The microprocessor 1530 may receive and process various electric signals, output processing results, and control the other components of the electronic circuit board 1500. The microprocessor 1530 may be understood as a central processing unit (CPU) and/or a main control unit (MCU), for example.

The main memory circuit 1535 may temporarily store data always or frequently needed by the microprocessor 1530 or data before/after being processed. Since fast response is demanded to the main memory circuit 1535, the main memory circuit 1535 may consist of a semiconductor memory chip. In detail, the main memory circuit 1535 may be a semiconductor memory referred to as a cache, a static random access memory (SRAM), a dynamic random access memory (DRAM), a resistive random access memory (RRAM), or an applications thereof (e.g., an utilized RAM, a ferro-electric RAM, a fast cycle RAM, a phase changeable RAM, a magnetic RAM, and one of other semiconductor memories).

In addition, the main memory circuit 1535 may be volatile or non-volatile and may include a random access memory. According to the present embodiment, the main memory circuit 1535 may include at least one or more semiconductor packages or semiconductor modules according to an exemplary embodiment. The supplementary memory circuit 1540 is a large-capacity memory element and may be a non-volatile semiconductor memory, such as a flash memory, or a hard disk drive using a magnetic field. Alternatively, the supplementary memory circuit 1540 may be a compact disc drive using lights. Compared to the main memory circuit 1535, the supplementary memory circuit 1540 may be used when it is necessary to store a large amount of data, where a fast response is not demanded. The auxiliary memory circuit 1240 may be random or non-random memory and may include a non-volatile memory element.

The supplementary memory circuit 1540 may include a semiconductor package or a semiconductor module according to an exemplary embodiment. The input signal processing circuit 1545 may convert an external command to an electric signal or may transmit an electric signal transmitted from outside to the microprocessor 1530.

A command or an electric signal transmitted from outside may be an operation command, an electric signal to process, or data to be stored. The input signal processing circuit 1545 may be a terminal signal processing circuit for processing signals transmitted from a keyboard, a mouse, a touch pad, an image recognizing apparatus, or various sensors, an image signal processing unit for processing image signals input via a scanner or a camera, or an interface for various sensors or receiving input signals. The input signal processing circuit 1545 may include a semiconductor package or a semiconductor module according to an exemplary embodiment.

The output signal processing circuit 1550 may be a component for outputting electric signals processed by the microprocessor 1530 to outside. For example, the output signal processing circuit 1550 may be a graphic card, an image processor, an optical converter, a beam-panel card, or interface circuits having various functions. The output signal processing circuit 1550 may include a semiconductor package or a semiconductor module according to an exemplary embodiment.

The communication circuit 1555 is a component for directly transmitting and receiving electric signals to and from another electronic system or another circuit board without an input signal processing circuit 1245 or an output signal processing circuit 1250. For example, the communication circuit 1555 may be a modem for a personal computer system, a LAN card, or one of various interface circuits. The communication circuit 1555 may include a semiconductor package or a semiconductor module according to an exemplary embodiment.

Figure 49:
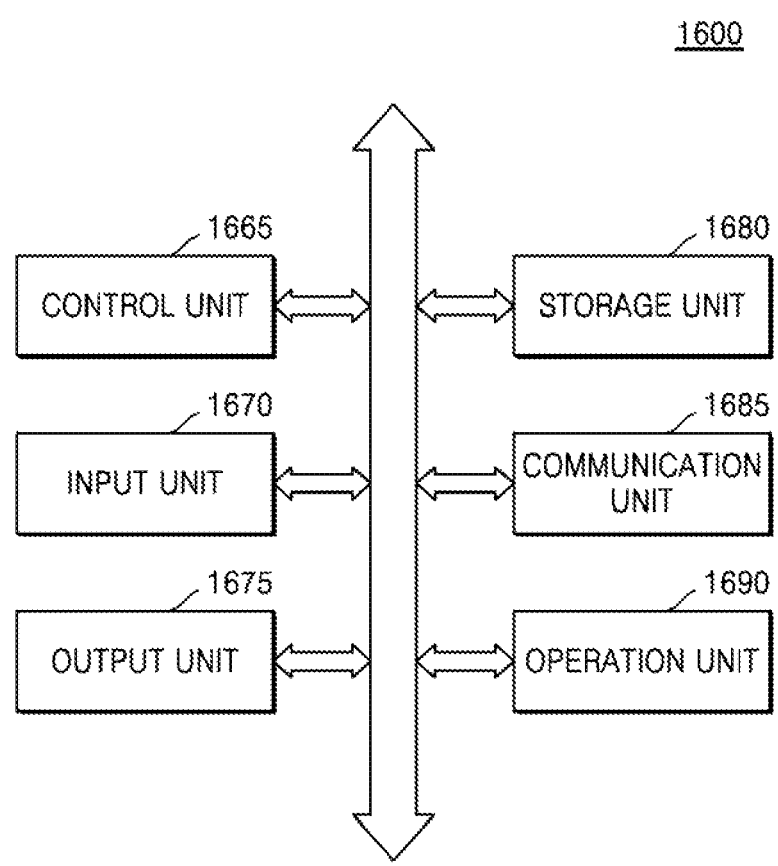
FIG. 49 is a schematic block diagram showing an electronic system including a semiconductor package according to an exemplary embodiment.

FIG. 49 is a schematic block diagram showing an electronic system including a semiconductor package according to an exemplary embodiment.

In detail, an electronic circuit board 1600 may include a control unit 1665, an input unit 1670, a output unit 1675, and a storage unit 1680 and may further include a communication unit 1685 and/or an operation unit 1690.

The control unit 1665 may control the electronic system 1600 and the components thereof. The control unit 1665 may be understood as a CPU or a MCU and may include an electronic system (1500 of FIG. 48) according to an exemplary embodiment. Furthermore, the control unit 1665 may include a semiconductor package or a semiconductor module according to an exemplary embodiment.

The input unit 1670 may transmit an electric command signal to the control unit 1665. The input unit 1670 may be a keyboard, a keypad, a mouse, a touch pad, an image recognizing apparatus like a scanner, or one of various sensors. The input unit 1670 may include a semiconductor package or a semiconductor module according to an exemplary embodiment.

The output unit 1675 may receive an electric command signal from the control unit 1665 and output a result processed by the electronic system 1600. The output unit 1675 may be a monitor, a printer, a beam projector, or one of various other mechanical apparatuses. The output unit 1675 may include a semiconductor package or a semiconductor module according to an exemplary embodiment.

The storage unit 1680 may be a component for temporarily or permanently storing electric signals to be processed or processed by the control unit 1665. The storage unit 1680 may be physically and/or electrically connected to or combined with the control unit 1665. The storage unit 1680 may be a semiconductor memory, a magnetic storage device like a hard disk drive, an optical storage device like a compact disc drive, or one of other servers having data storage function. Furthermore, the storage unit 1680 may include a semiconductor package or a semiconductor module according to an exemplary embodiment.

The communication unit 1685 may receive an electric command signal from the control unit 1665 and transmit or receive an electric signal to or from another electronic system. The communication unit 1685 may be a wired transmission/reception device, such as a modem and a LAN card, a wireless transmission/reception device, such as a Wibro interface, or an infrared ray port. Furthermore, the communication unit 1685 may include a semiconductor package or a semiconductor module according to an exemplary embodiment.

The operation unit 1690 may perform a physical or mechanical operation according to a command from the control unit 1665. For example, the operation unit 1690 may be a component for performing a mechanical operation, such as a floater, an indicator, or an up/down operator. The electronic system 1600 according to an exemplary embodiment may be a computer, a network server, a network printer or scanner, a wireless controller, a mobile communication terminal, a switchboard, or one of other electronic devices for performing programmed operations.

Furthermore, the electronic system 1600 may be used in a mobile phone, a MP3 player, a navigation apparatus, a portable multimedia player (PMP), a solid state disk (SSD), or one of various household appliances.

Figure 50:
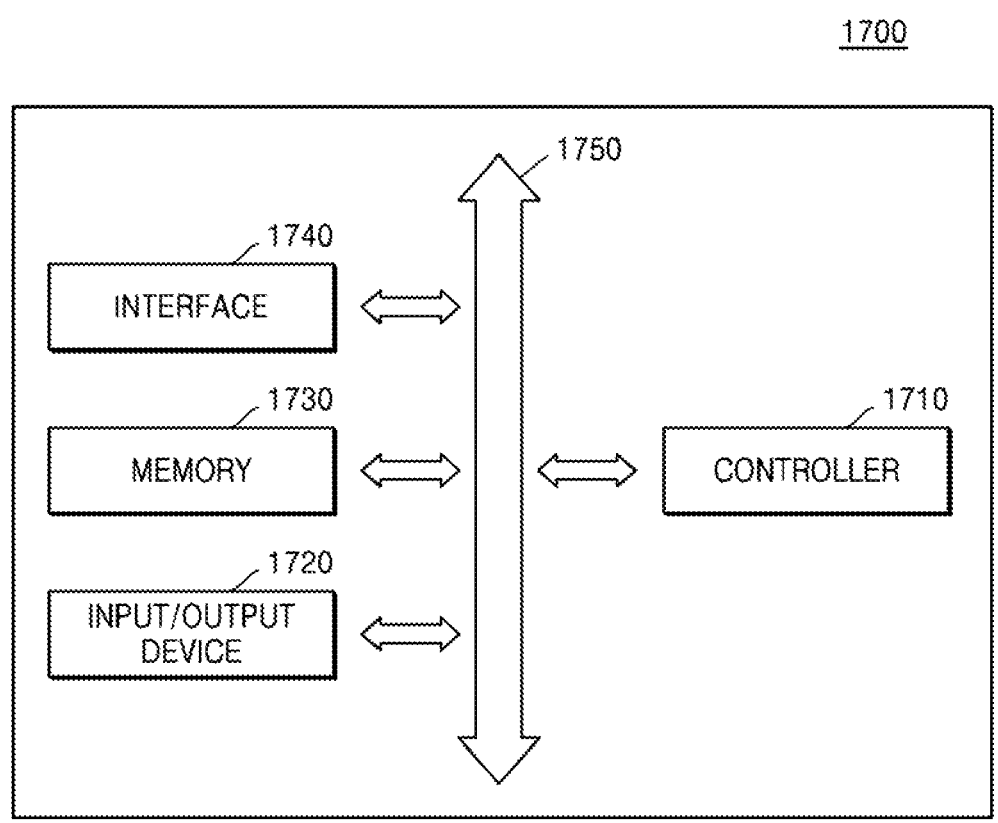
FIG. 50 is a schematic diagram showing an electronic system including a semiconductor package according to an exemplary embodiment.

FIG. 50 is a schematic diagram showing an electronic system including a semiconductor package according to an exemplary embodiment.

In detail, an electronic system 1700 may include a controller 1710, an input/output device 1720, a memory 1730, and an interface 1740. The electronic system 1700 may be a mobile system or a system for transmitting or receiving data. The mobile system may be a personal digital assistant (PDA), a portable computer, a web tablet, a wireless phone, a mobile phone, a digital music player, or a memory card.

The controller 1710 may execute a program and control the electronic system 1700. The controller 1710 may include a semiconductor package according to an exemplary embodiment. For example, the controller 1710 may be a microprocessor, a digital signal processor, a microcontroller, or the like.

The input/output device 1720 may be used to input or output data to or from the electronic system 1700. The electronic system 1700 may be connected to an external device, e.g., a personal computer or a network, via the input/output device 1720 and exchange data with the external device. The input/output device 1720 may be a keypad, a keyboard, or a display apparatus.

The memory 1730 may store codes and/or data for operating the controller 1710 and/or store data processed by the controller 1710. The memory 1730 may include a semiconductor package according to an exemplary embodiment. The interface 1740 may be a data transmission path between the electronic system 1700 and another external apparatus. The controller 1710, the input/output device 1720, the memory 1730, and the interface 1740 may communicate with one another via a bus 1750.

For example, the electronic system 1700 may be used in a mobile phone, a MP3 player, a navigation apparatus, a portable multimedia player (PMP), a solid state disk (SSD), or one of various household appliances.

Figure 51:
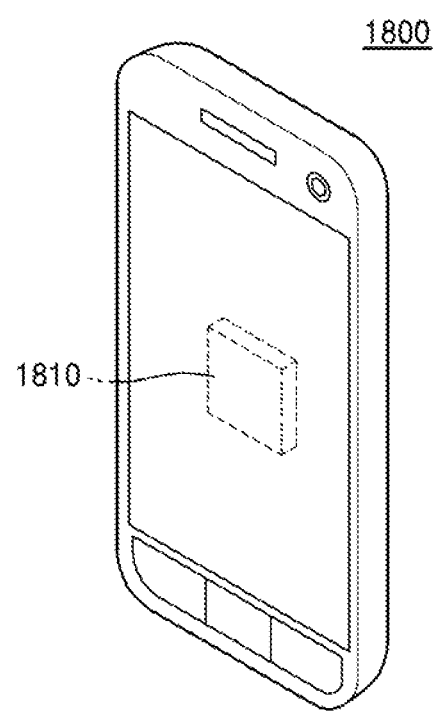
FIG. 51 is a schematic perspective view of electronic system including a semiconductor package according to an exemplary embodiment.

FIG. 51 is a schematic perspective view of electronic system including a semiconductor package according to an exemplary embodiment.

In detail, FIG. 51 shows an example that the electronic system 1700 of FIG. 50 is applied to a mobile phone 1800. The mobile phone 1800 may include a system-on-chip 1810. The system-on-chip 1810 may include a semiconductor package according to an exemplary embodiment. Since the mobile phone 1800 may include the system-on-chip 1810 at which a relatively high performance main function block may be arranged, the mobile phone 1800 may be a relatively high performance mobile phone 1800. Furthermore, since the system-on-chip 1810 may exhibit relatively high performance at a same area, the mobile phone 1800 may exhibit relatively high performance while size of the mobile phone 1800 is greatly reduced.

While the present inventive concept has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A semiconductor package comprising:
   a first chip;
   a second chip mounted on the first chip and connected to the first chip through an internal connection member;
   an encapsulation layer encapsulating the second chip and exposing a front surface of the second chip;
   a plurality of intermediate chips mounted on each other and interposed between the first chip and the second chip, and
   a stress controlling layer disposed on the front surface of the second chip,
   wherein the stress controlling layer has an internal stress to the extent that the stress controlling layer prevents the second chip from having warpage,
   wherein the first chip is a bottommost chip of the semiconductor package, and
   wherein the second chip is an uppermost chip connected to the first chip through the plurality of intermediate chips.

2. The semiconductor package of claim 1,
   wherein the encapsulation layer includes an underfill or a molding member.

3. The semiconductor package of claim 1,
   wherein the encapsulation layer is formed between the first chip and the second chip or
   wherein the encapsulation layer is formed between the first chip and the second chip and on two lateral surfaces of the second chip.

4. The semiconductor package of claim 3,
   wherein the stress controlling layer is formed on the front surface of the second chip and an upper surface of the encapsulation layer, and
   wherein the front surface of the second chip and the upper surface of the encapsulation layer are substantially coplanar.

5. The semiconductor package of claim 1,
   wherein a size of the first chip is greater than or equal to a size of the second chip.

6. The semiconductor package of claim 1, further comprising:
   a chip penetrating via electrode connecting the first chip to the second chip;
   a base encapsulation layer filling a space between the first chip and the second chip;
   wherein the encapsulation layer encapsulates the first chip, the second chip and the base encapsulation layer; and wherein the stress controlling layer includes a first stress controlling layer disposed on a surface of the encapsulation layer.

7. The semiconductor package of claim 6, further comprising:
a second stress control layer disposed on a rear surface of the base encapsulation layer encapsulating the first chip and a surface of the first chip.

8. A semiconductor package comprising:
a base chip;
a plurality of chips, wherein the base chip and the plurality of chips are stacked on each other and the base chip is a lowermost chip of a stacked chip of the base chip and the plurality of chips;
a first stress controlling layer;
a base encapsulation layer interposed between the first stress controlling layer and the base chip;
a second stress controlling layer interposed between the base chip and a bottommost chip of the plurality of chips;
an encapsulation layer covering the stacked chip;
a third stress controlling layer disposed on an upper surface of the encapsulation layer,
wherein the first stress controlling layer and the second stress controlling layer are arranged to prevents the base chip from having warpage, and
wherein the third stress controlling layer has an internal stress such that the third stress controlling layer prevents an uppermost chip of the plurality of chips from having warpage.

9. The semiconductor package of claim 8,
wherein each of the plurality of chips and the base chip includes a chip penetrating via electrode penetrating each of the plurality of chips and the base chip, and a chip pad disposed on a first surface of each of the plurality of chips and the base chip,
wherein the chip penetrating via electrode is electrically connected to the chip pad,
wherein the chip penetrating via electrode of the base chip is electrically connected to the chip pad of the lowermost chip of the plurality of chips.

10. The semiconductor package of claim 9, further comprising:
an external connection member protruding from the base encapsulation layer, wherein the external connection member is electrically connected to the chip pad of the base chip.

11. The semiconductor package of claim 10,
wherein the external connection member includes a first external connection member and a second external connection member,
wherein the first external connection member is enclosed by the base encapsulation layer and has an exposed surface which is not enclosed by the base encapsulation layer, and
wherein the second external connection member is disposed on the exposed surface of the first external connection member.

12. The semiconductor package of claim 10,
wherein the encapsulation layer is in contact with the base encapsulation layer.

* * * * *